United States Patent
Marek

(10) Patent No.: US 6,747,455 B2
(45) Date of Patent: Jun. 8, 2004

(54) MAGNETIC HOMOGENIZATION OF SUPERCONDUCITNG RF COILS FOR THE RECEPTION OF NMR SIGNALS

(75) Inventor: Daniel Marek, Moeriken (CH)

(73) Assignee: Bruker Biospinag, Fällanden (CH)

(*) Notice: Subject to any disclaimer, the term of this patent is extended or adjusted under 35 U.S.C. 154(b) by 0 days.

(21) Appl. No.: 10/338,854

(22) Filed: Jan. 9, 2003

(65) Prior Publication Data

US 2003/0141871 A1 Jul. 31, 2003

(30) Foreign Application Priority Data

Jan. 29, 2002 (DE) .......................... 102 03 279

(51) Int. Cl.[7] .............................. G01V 3/00
(52) U.S. Cl. ...................... 324/318; 324/322
(58) Field of Search .................. 324/318, 315, 324/309, 322, 307, 320, 319; 335/296; 600/421

(56) References Cited

U.S. PATENT DOCUMENTS

| | | | | |
|---|---|---|---|---|
| 4,647,858 A | * | 3/1987 | Bottomley | 324/320 |
| 5,221,903 A | | 6/1993 | Kasten | |
| 5,258,710 A | * | 11/1993 | Black et al. | 324/309 |
| 5,572,127 A | | 11/1996 | Wong | |
| 5,619,140 A | | 4/1997 | Brey et al. | |
| 5,994,901 A | * | 11/1999 | McIntyre et al. | 324/303 |
| 6,121,776 A | | 9/2000 | Marek | |
| 6,538,545 B2 | * | 3/2003 | Wakuda et al. | 335/296 |
| 6,556,013 B2 | * | 4/2003 | Withers | 324/322 |
| 6,605,945 B2 | * | 8/2003 | Marek | 324/318 |

FOREIGN PATENT DOCUMENTS

| | | | |
|---|---|---|---|
| WO | WO 99/24 821 | | 5/1999 |
| WO | wo 99/24821 | * | 5/1999 |
| WO | WO 99/24 845 | | 5/1999 |

* cited by examiner

Primary Examiner—Brij B. Shrivastav
(74) Attorney, Agent, or Firm—Paul Vincent

(57) ABSTRACT

A method for influencing the homogeneous static magnetic field $B_0$ in the direction of a z axis in an NMR apparatus with disturbances caused by superconducting components of RF coils for receiving NMR signals in a sample in a measuring volume of the NMR apparatus, wherein the superconducting components of the RF coils extend past the RF active region of the sample in the z direction, wherein the disturbances concern the z component of the $B_0$ field in the RF active region of the sample, is characterized in that the superconducting components of the RF coils are exposed to an additional magnetic field which is sufficiently strong that, in the course of application, all superconducting structures disposed in the vicinity of the RF active region of the sample in the superconducting components of the RF coils are maximally magnetized and thereby their magnetization transverse to $B_0$ along the z axis assumes a value which is substantially constant and different from zero. The invention also concerns an NMR resonator with at least one RF coil, wherein superconducting conductor structures of the NMR resonator are disposed at a radial separation from the measuring sample with the superconducting conductor structures extending beyond the RF active part of the measuring sample in the z direction. The NMR resonator is characterized in that, after application of an additional magnetic field which maximally magnetized all superconducting conductor structures, the superconducting conductor structures have a transverse magnetization with respect to the direction of $B_0$ with a value other than zero and which is substantially constant along the z axis. This eliminates the NMR relevant field disturbances of the RF coil.

18 Claims, 16 Drawing Sheets

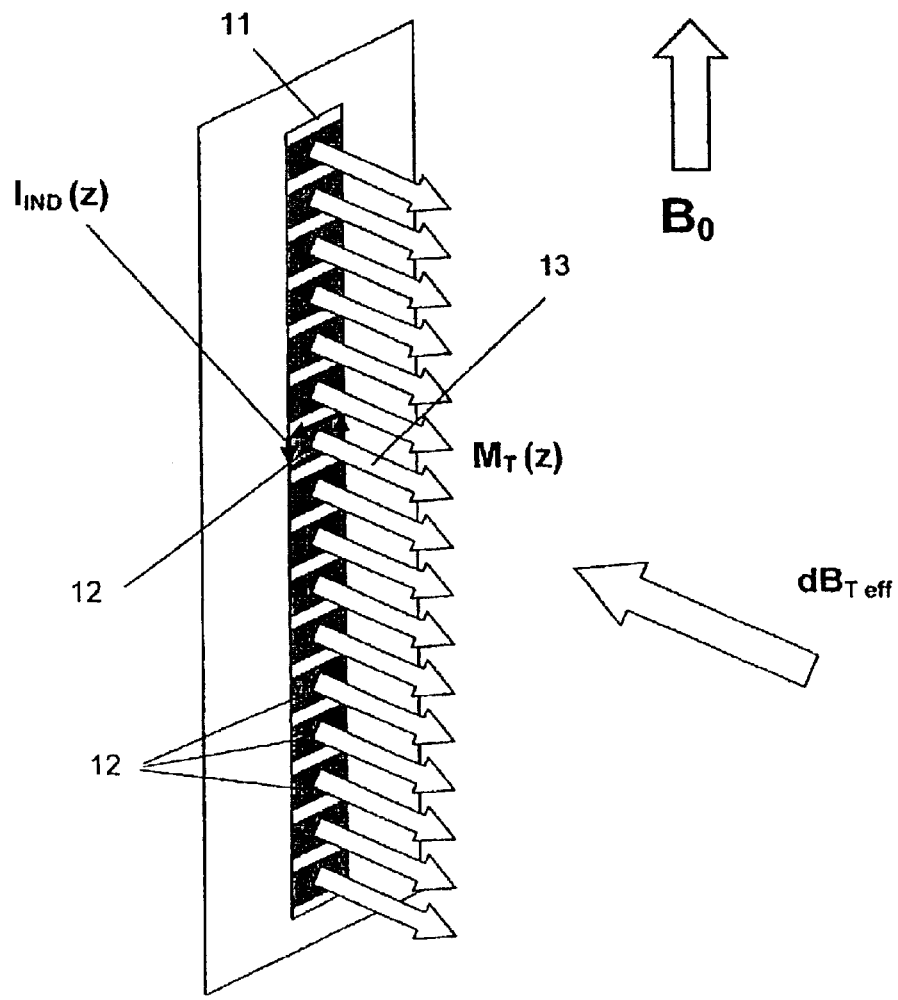
Fig. 3a
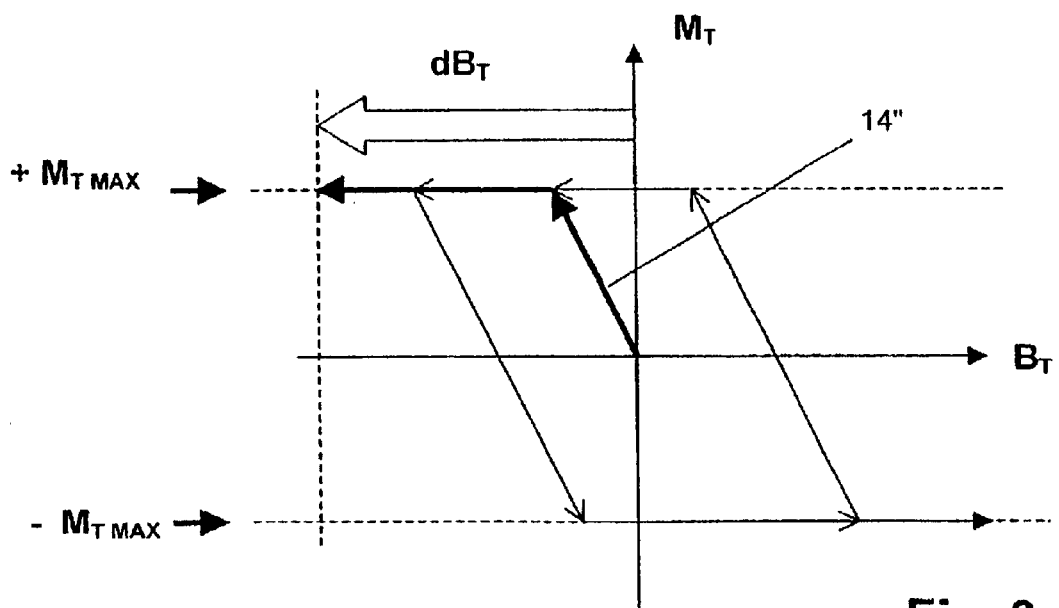
Fig. 3b
Fig. 3

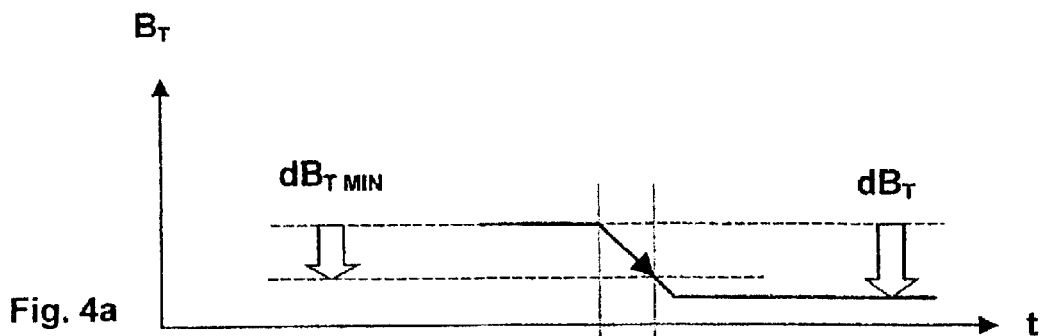
Fig. 4a
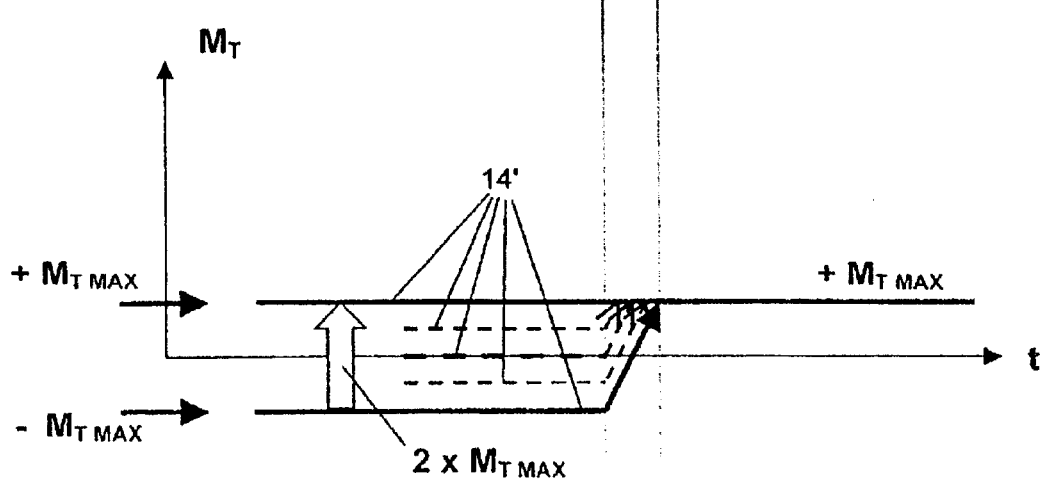
Fig. 4b
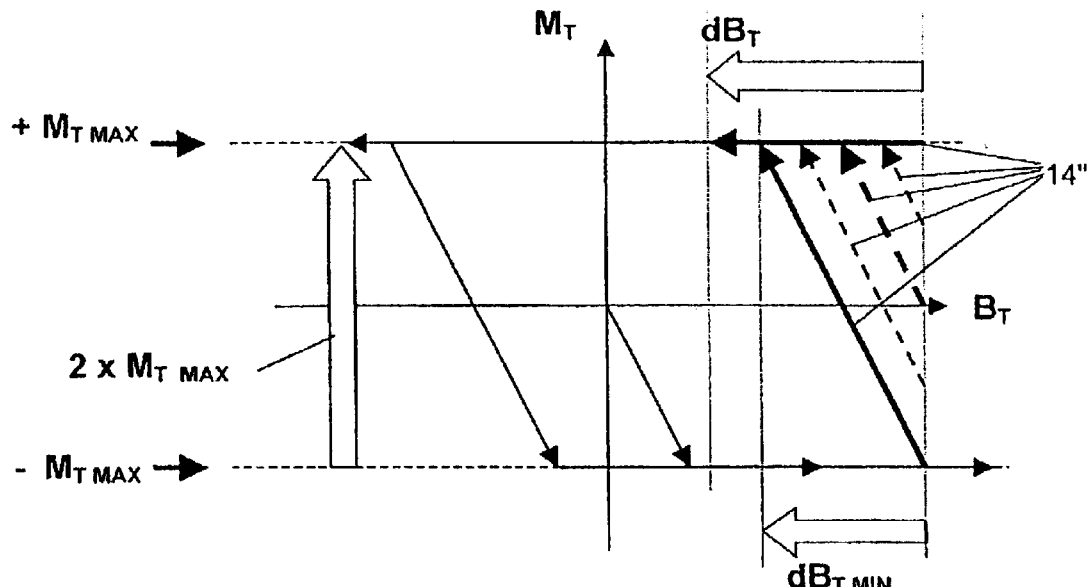
Fig. 4c
Fig. 4

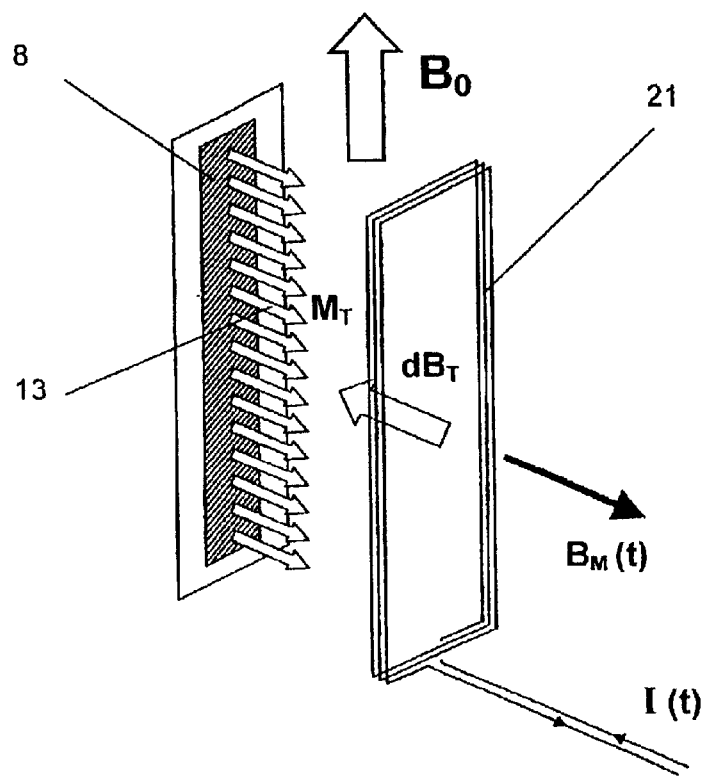
Fig. 5a
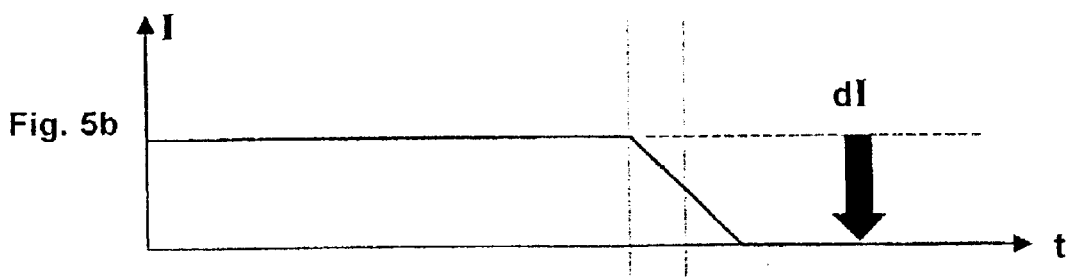
Fig. 5b
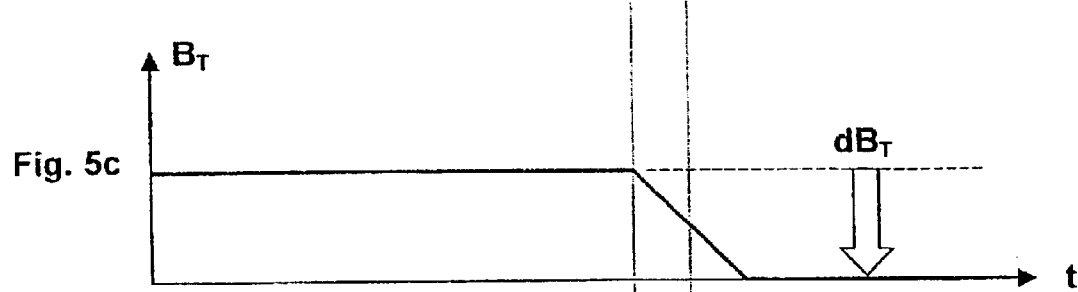
Fig. 5c
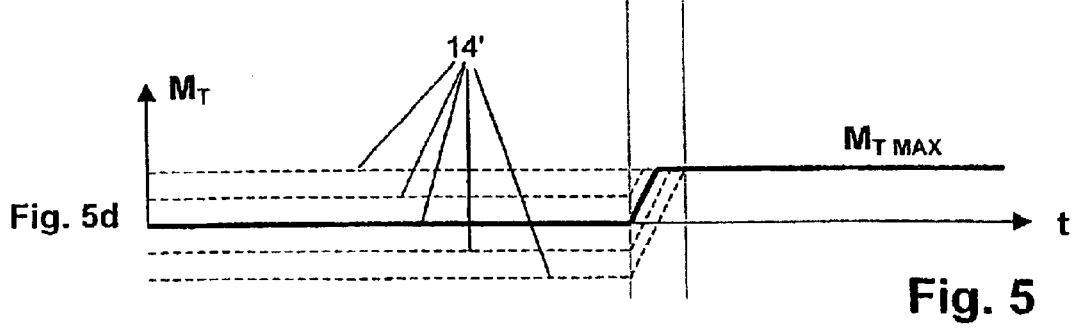
Fig. 5d
Fig. 5

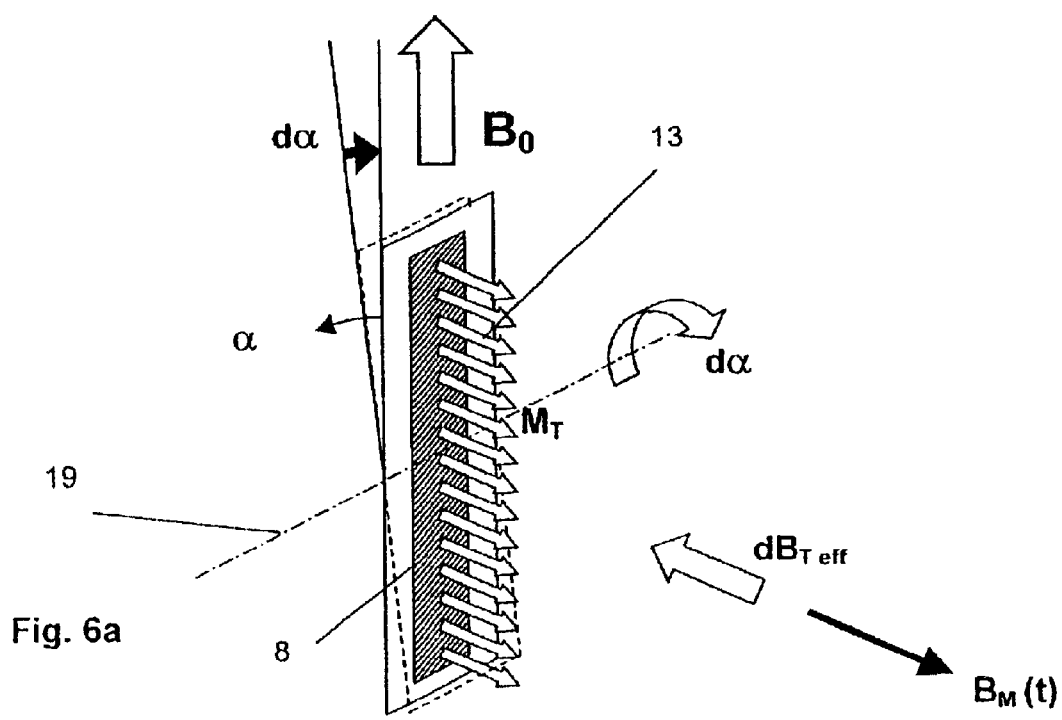
Fig. 6a
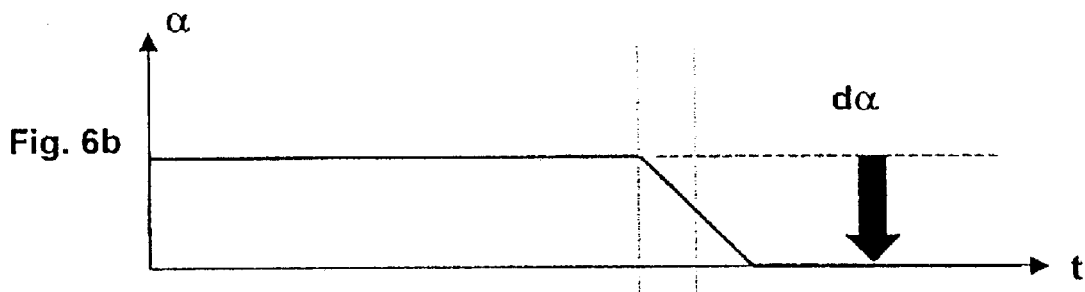
Fig. 6b
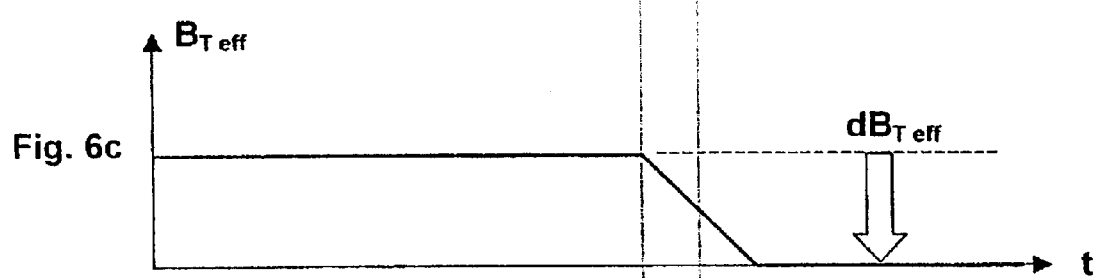
Fig. 6c
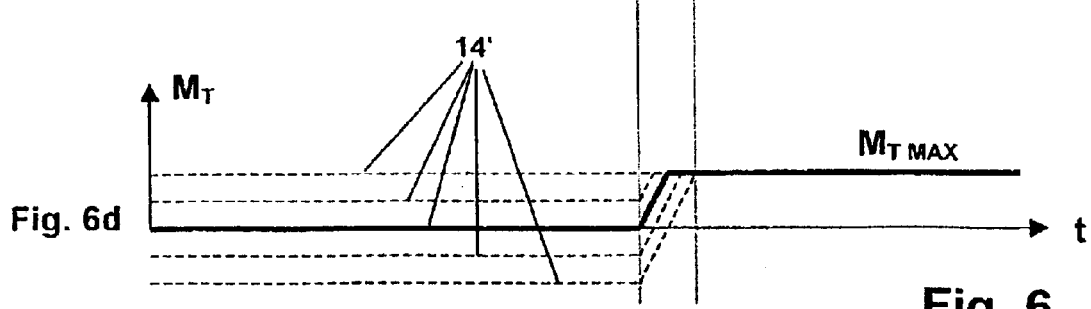
Fig. 6d
Fig. 6

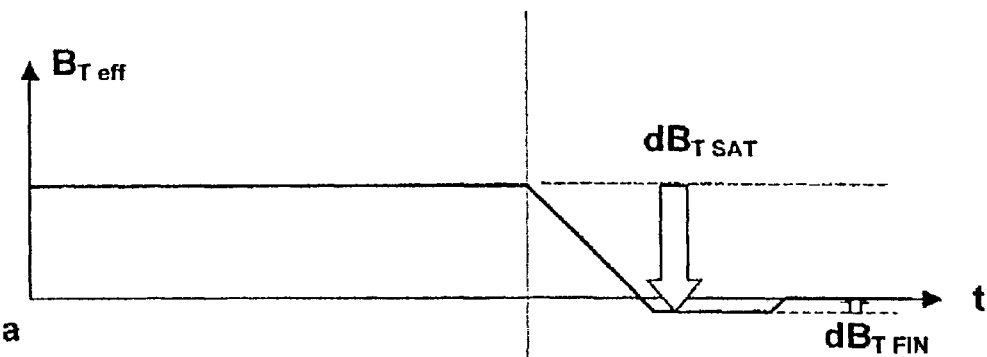
Fig. 13a
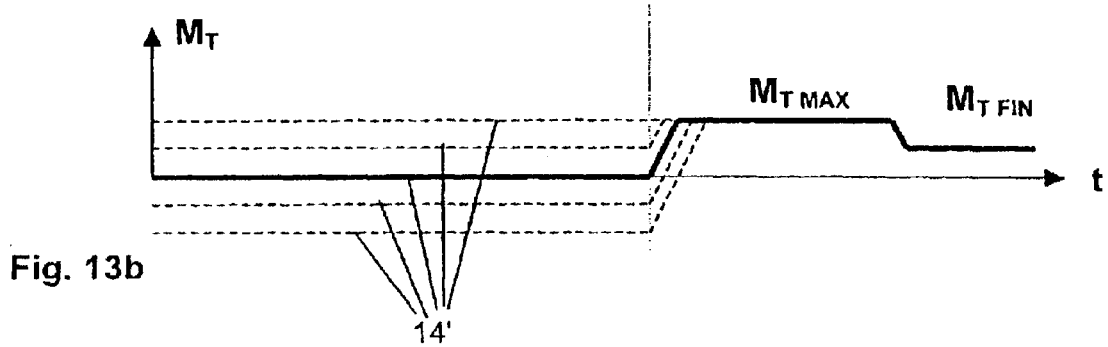
Fig. 13b
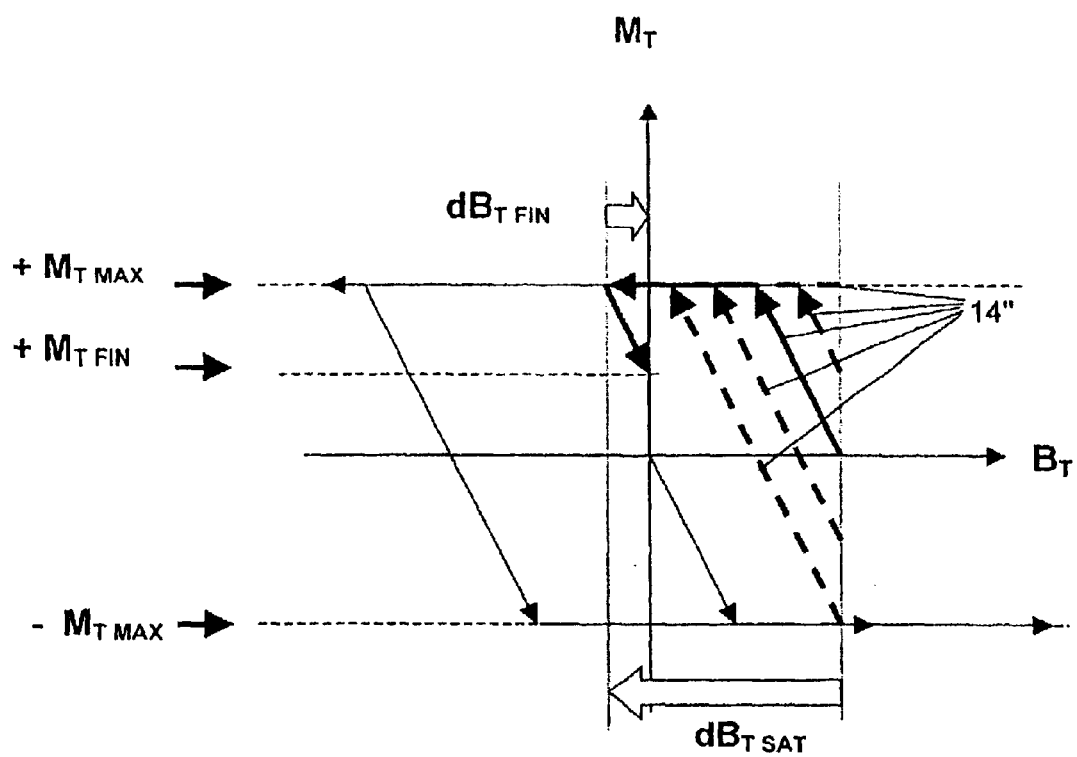
Fig. 13c
Fig. 13

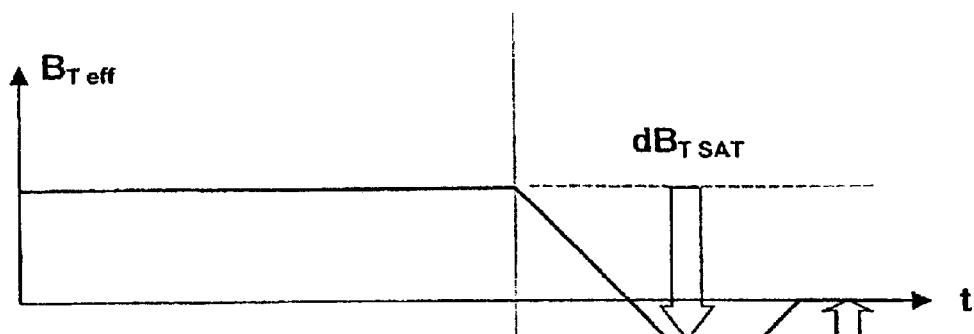
Fig. 14a
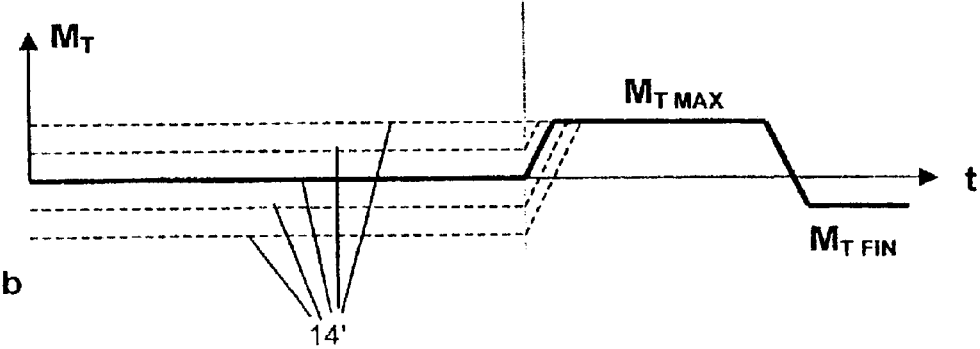
Fig. 14b
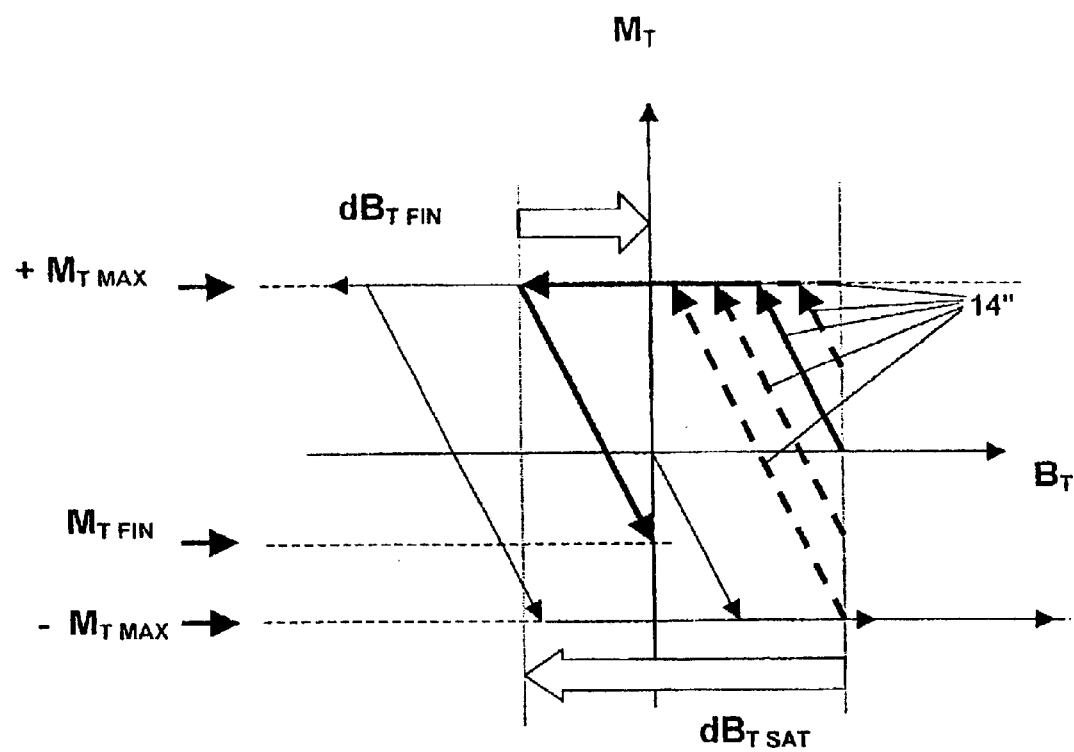
Fig. 14c
Fig. 14

US 6,747,455 B2

MAGNETIC HOMOGENIZATION OF SUPERCONDUCITNG RF COILS FOR THE RECEPTION OF NMR SIGNALS

This application claims Paris Convention priority of DE 102 03 279.3 filed Jan. 29, 2002 the complete disclosure of which is hereby incorporated by reference.

BACKGROUND OF THE INVENTION

The invention concerns a method for influencing the homogeneous static magnetic field $B_0$ in the direction of a z axis in a nuclear magnetic resonance (NMR) apparatus having disturbances caused by superconducting components of radio frequency (RF) coils for receiving NMR signals of a sample in a measuring volume of the NMR apparatus, wherein the superconducting components of the RF coils project past the RF active region of the sample in the z direction, and wherein the disturbances effect the z component of the $B_0$ field in the RF active region of the sample. The invention also concerns an NMR (nuclear magnetic resonance) resonator with at least one RF (radio frequency) coil for emitting and/or receiving RF signals at one or more desired resonance frequencies into and/or from a measuring sample in an investigational volume of an NMR apparatus, disposed about a coordinate origin (x,y,z=0), having means for generating a homogeneous magnetic field $B_0$ in the direction of a z axis, wherein superconducting conductor structures of the NMR resonator are disposed at a radial (x,y) separation from the measuring sample, and wherein the superconducting conductor structures project past the RF active part of the measuring sample in the z direction.

A corresponding device is disclosed in the document DE 101 50 131.5-33 (cited ref. [6]), which does not constitute prior art with respect to the present invention.

NMR is a very distinctive analysis method which is, however, not very sensitive. According to prior art, it is possible to considerably improve the S/N (signal to noise) ratio through use of cooled and in particular superconducting radio frequency coils (see reference [1]). The main problem involved in the use of superconductors in NMR receiving systems (RF receiving coil) is their static magnetization. It can, if not controlled, cause field disturbances within the sample of such a strength that the line width becomes unsuitably large. A number of methods to minimize this undesired magnetization have been published: [2], [3], [4]. The described methods are, however, complicated and have further disadvantages which are described below. In particular, with coils according to [1], substantial disturbing fields are produced in response to subsequent transverse magnetic fields.

There are two classes of coil arrangements (described in [5] and [6]) which, in addition to other advantages, are immune to such disturbances and are therefore superior to the above-mentioned coil types [1], also when methods [2,3] are used.

Despite their advantages, if the coils of [5] or [6] are not uniformly magnetized, they lose their favorable properties.

As shown in detail in [2], global magnetization of a type II superconductor results from induced currents which flow in closed paths within the superconductor. These are determined by the history of the superconductor and, as long as the external conditions do not change, remain constant for a practically unlimited time due to the zero resistance of the superconductor. These currents generate a magnetic field outside of the superconductor which can produce strong undesired field disturbances in the sample volume.

Disturbances in the spectra due to inhomogeneities of the static magnetic field caused by superconducting RF coils have been conventionally minimized using the following strategies:

A. Minimization of Disturbances in the Spectra According to Prior Art through

A1 minimization of the maximum possible size of magnetization (through subdivision of the coil into sufficiently narrow strips [1], [5]).

A2 preventing the generation of any possible residual magnetization.

In all conventional methods, the superconductor is always cooled in the magnetic field so that the undisturbed form of the magnetic field lines is always frozen therein during the superconducting transition of the type II superconductor. This minimizes the production of field lines which differ from the original homogeneous $B_0$ field dependence, and therefore also minimizes disturbances of the homogeneity of the magnetic field. The patent document [4] even recommends carrying out this cooling process as slowly as possible so that the $B_0$ field is frozen as uniformly as possible and without disturbances.

A3 Post-treatment of the superconducting coil with a sequence of decreasing transverse magnetic fields for "demagnetization" [2], [3] (a current structure with closely adjacent opposite current regions is thereby induced such that the sum of the individual magnetic field contributions cancels to a good approximation).

All previous methods are based on a common effort of minimizing or completely eliminating the effective magnetic susceptibility and therefore the magnetization of the superconducting coil(s) and the external magnetic fields produced thereby to minimize the magnetic fields which they generate in the sample.

The final aim of all methods and devices discussed herein is actually to eliminate the NMR disturbances in the spectra produced by the superconducting (SC) coils. We will see that this is not necessarily equivalent to minimization or elimination of the effective susceptibility or minimization/elimination of the additional fields produced by the SC coils. This subtle but very substantial difference in the goals has been completely ignored in prior art [2], [3], [4] and all previous approaches therefore concentrated on the elimination or reduction of all additional fields produced by the SC coils. If this difference is analyzed precisely, completely different solutions of this central object become possible, namely elimination or significant reduction of NMR disturbances in the spectra.

It is therefore the object of the present invention to transfer radio frequency coils with homogeneous transverse saturation magnetization, i.e. coils in accordance with [5] and a subset of the coils according to [6], from any magnetization state into a state in which the NMR relevant field disturbances are essentially eliminated.

SUMMARY OF THE INVENTION

This object is achieved in accordance with the inventive method in a surprisingly simple and effective fashion in that the superconducting components of the RF coils are exposed to an additional magnetic field which is sufficiently strong that, during application of this additional magnetic field, all superconducting structures in the superconducting components of the RF coils disposed in the vicinity of the RF active region of the sample are magnetized to a maximum possible extent, wherein their magnetization along the z axis and transverse with respect to $B_0$ assumes a value which is substantially constant and different from zero.

This object is also achieved in accordance with the invention in a device having superconducting conductor structures which are magnetized transverse to the $B_0$ direction after application of an additional magnetic field with maximum magnetization of all superconducting conductor structures, the magnetization along the z axis having a substantially constant value different than zero.

Many of the coils having superconductors which extend sufficiently beyond the RF region ([5], [6]) can be freed from magnetic disturbances using the present invention in a simple and rapid fashion.

In contrast to the conventional methods [2], [3], [4], the present invention eliminates NMR disturbances through homogenisation, in the simplest form through maximizing the magnetization of the superconductor and associated maximizing the magnetic disturbing fields in the sample. This fact would appear at first glance to be completely contradictory and is incompatible with the known methods. However, as described below, it produces the desired success in the coil class under discussion. Moreover, the inventive method is very simple compared to conventional methods: it requires simple or no additional hardware and leads to very robust and reproducible results.

The essentials of the present invention are explained below:

B Inventive Method

B1 The coils of [6], having superconductors whose critical currents are isotropic, in the embodiments 3 or 4 of [6] or birdcage coils according to arrangements such as ([5], FIG. 1), are hereby designated "CHTSM" (Coils with Homogeneous Transverse Saturation Magnetisation). Such coil arrangements 8 are shown in FIG. 2, together with the sample tube 7.

As shown in [6], it is not essential for shimming that all field components of an additional disturbing field dB in the sample generated by the SC coils become small. ONLY the $B_z$ component must be minimized or at least homogenized. The coils described in [6] are based on this finding. They generate a transverse magnetization density in response to external transverse fields which is homogeneous along $B_0$. This leads, irrespective to the size of transverse magnetization, to a negligible $B_z$ component at the sample location. It is thereby important that the transverse magnetization density is constant over z.

B2 In accordance with the invention, the required z homogeneity of transverse magnetization can be obtained for CHTSM coils without utilizing the methods of A2 or A3. It is very important to realize that a constant magnetization over z is important and not the absolute size of that magnetization. If a constant dependence is obtained, the goal is achieved. For CHTSM coils, this is obtained in accordance with the invention in that the constant nature (in z) of the maximum (saturation) magnetization is used. This is inherent in this class of coils.

B3 It is possible to generate a homogeneous transverse magnetization in z following any magnetization state (having, in general, a non-uniform magnetization in z: see FIG. 1a), in that all partial structures are magnetized not to a minimum degree but rather homogeneously, in particular, to a maximum. This also maximizes the disturbing fields dB at the sample location. These are, in general, not homogeneous (large inhomogeneities in the x,y plane) and can be very large, as shown in FIG. 1b.

B4 This maximum magnetization of SC is provided by the geometry (width, thickness) of the individual elements and by the critical current density of the superconductor along the longest dimension of the elements.

B5 For coils of corresponding design (CHTSM coils, B1 above), this produces a large (maximum intensity) but very precisely defined transverse magnetization $M_T$ which is uniform along z (FIG. 3).

B6 This eliminates the NMR relevant disturbances in accordance with [6] (see FIG. 1b).

B7 This lack of disturbances remains for all later times in accordance with [6] unless excessively strong inhomogeneous transverse magnetic fields are applied.

As stated above, one single very strong magnetic pulse or application of a strong transverse magnetic field is sufficient for the CHTMS coil types to eliminate the relevant NMR disturbances. This has the following advantages over the conventional methods [2,3]:

C. Advantages

C1 One single pulse is sufficient. Complicated pulse shapes and sequences are not required.

C2 The strength of the pulse must be sufficiently large. Exact adjustments to the SC material used are not required.

C3 This saturation can be carried out very fast since decreasing sequences such as in [2,3] are not required.

C4 No precise devices are required.

C5 Due to the above, the magnetic treatment can also be carried out before/during/between pulse sequences.

C6 In the simplest case, no additional devices are required for the method.

In a simple embodiment, the method can be effected using a transverse field coil 21. FIG. 5 represents the magnetization field $B_T$. It is important that the change $dB_T$ be sufficiently large. This can be effected in different ways: in the simplest case, through switching off the previously switched-on current (FIGS. 5b, 5c). Irrespective of the initial magnetization (fully drawn or broken lines in FIG. 5d) the transverse magnetization $M_T$ approaches a maximum, well-defined value $M_{T\ MAX}$ which is constant along z. The magnetic fields $B_M$ produced in the sample 7 therefore also approach a maximum value which is constant along z.

In view of C1, C2, C4, implementation is very easy through mechanical tilting of the superconducting coil arrangement. One single motion or one single reciprocating motion having an abutment or stop is sufficient. Control of the amplitude is not necessary (it must be ensured that a minimum amplitude is obtained) as is shown, in the simplest form, in FIG. 6. The result is independent of the initial magnetization state (differently broken lines in FIG. 6d, all resulting in $M_{T\ MAX}$).

The same argumentation as in B5 above permits very simple implementation of the method in that no special device is required: The probe head is withdrawn from the magnet (to a sufficient extent) in the cold state (superconducting (SC) coils below the critical temperature Tc), and then re-inserted. As a result thereof, the radial $B_0$ components (which are present outside of the homogeneous region ("plateau") of the magnet due to the outward curvature of the field lines (see FIG. 18) automatically subject the SC coil to a very strong transverse field change $dB_{T\,eff}$ (FIG. 19) which increases monotonically during insertion. (Or the probe head is cooled down below Tc only outside of the magnet in contrast to [4] and then inserted in the cold state).

FIG. 19 shows the dependence of $M_T(z)$ on the motion of the SC coil during insertion into the magnet. This method is advantageous due to the rotational symmetry about z, since not only planar structures are saturated in one orientation (e.g. parallel to x) but also those with perpendicular orientation (parallel to y) or any other orientation.

As illustrated above, the method constitutes a completely new, very effective robust and inexpensive way of conditioning superconducting NMR coils such that they cause no disturbances in the NMR spectrum. These methods and devices form, together with the CHTSM coils, an important component for broad application of SC technology in NMR receiving coils.

A preferred variant of the inventive method is characterized in that the temporal dependence of the additional magnetic field is selected such that the superconducting structures remain maximally magnetized after application of the additional magnetic field, thereby maximizing the magnetic field in the sample region caused thereby. This final state of the RF coil magnetization is particularly easy to produce, in particular, with one single magnetic pulse.

In a particularly preferred method variant, the additional magnetic field is applied transverse to the static magnetic field $B_0$. This is the simplest geometry to obtain the inventive transverse magnetization of the superconducting structures, wherein the entire additional magnetic field contributes to the transverse magnetization.

The above method variant can be realized in a particularly simple fashion in that the effective transverse additional magnetic field acting on the superconductor is produced through tilting of the superconducting coil or coil arrangement about an axis which is not parallel to the $B_0$ direction. This utilizes the static magnetic field $B_0$ for magnetization such that additional field-generating structures are not required.

In a method variant, the additional magnetic field can be generated by a field coil. This permits exactly defined introduction of the additional magnetic field e.g. as a sequence of magnetic pulses.

In a further preferred method variant, the additional magnetic field is generated by two or more field coils which are activated one after the other such that all components of the superconducting receiving coil arrangement which are disposed in the vicinity of the RF active region of the sample are maximally magnetized at least once during processing. This guarantees homogeneous magnetization of the superconducting structures even when the superconducting structures are oriented with a spatial distribution.

Another preferred method variant is characterized in that the effective transverse additional magnetic field which acts on the superconductor is generated by successive tilting of the superconducting receiving coil or receiving coil arrangement about two axes which are not parallel to the $B_0$ direction. This also guarantees homogeneous magnetization of the superconducting structures when the superconducting structures are oriented with spatial distribution. This variant requires, in particular, no additional structures to produce a magnetic field.

In a particularly preferred method variant, the transverse additional magnetic field is generated by first-time or repeated introduction of the already superconducting coil into the magnet producing the static magnetic field $B_0$. This is particularly simple and inexpensive.

In a further method variant, the additional transverse magnetic field is changed with only one sign to eliminate undesired demagnetization of the superconducting structures.

In a preferred method variant, the additional transverse magnetic field is one single pulse whose amplitude is dimensioned such that the final magnetization of the superconducting components is non-zero. Introduction of one single pulse is a magnetization method which requires little effort from a device standpoint.

In another method variant, the transverse additional magnetic field is a double or multiple pulse, wherein the last pulse has an amplitude and sign such that the final magnetization of the superconducting components is different from zero. This variant can be used to adjust a certain transverse magnetization other than zero and at the same time minimize disturbances resulting from application of the pulses.

In a further method variant, the transverse additional magnetic field is a double pulse, wherein the second pulse has a sign opposite that of the first pulse and the amplitudes of both pulses are approximately equal. The magnetization produced by the first pulse is thereby inverted by the second pulse. A double pulse has the favorable property that eddy currents induced in the neighboring structures are minimized.

In a preferred embodiment of the inventive NMR resonator, the superconducting conductor structures are substantially parallel to the $B_0$ direction to ensure maximum elimination of the $B_z$ component in the sample.

One embodiment of the inventive NMR resonator is characterized in that the material of the superconducting conductor structures is selected such that they remain maximally magnetized after application of the additional magnetic field thereby maximizing the magnetic field in the sample region caused thereby. In this fashion, the magnetization state remains uniquely defined after application of the additional magnetic field.

In a particularly preferred embodiment of the inventive device, the maximum magnetization transverse to the direction of $B_0$ of the superconducting conductor structures is substantially homogeneous over z. This provides particular easy setting of a transverse magnetization which is constant along the z axis and different from zero.

Further advantages of the invention can be extracted from the description and the drawing. The features mentioned above and below can be used in accordance with the invention either individually or collectively in any arbitrary combination. The embodiments shown and described are not to be understood as exhaustive enumeration, rather have exemplary character for describing the invention.

The invention is shown in the drawing and is explained in more detail by means of embodiments.

BRIEF DESCRIPTION OF THE DRAWING

FIG. 3a schematically shows the magnetization state of a striped partial piece of an inventively magnetized RF coil;

FIG. 3b shows the associated schematic analysis of the magnetic reaction of a surface element of the superconducting NMR receiving coil arrangement to an external field change;

FIG. 4a shows the temporal dependence of a simply stepped transverse magnetic field in a B-t plot;

FIG. 4b shows the associated temporal dependence of the coil magnetization in an M-t plot;

FIG. 4c shows the associated schematic analysis of the relationship between the external magnetic field and magnetization of a superconducting element;

FIG. 5a shows a schematic representation of the magnetization state of a striped partial piece of an RF coil which was magnetized with a field coil in accordance with the invention;

FIG. 5b shows the associated temporal dependence of the field coil current in an I-t plot;

FIG. 5c shows the associated temporal dependence of the transverse magnetic field in a B-t plot;

FIG. 5d shows the associated temporal dependence of coil magnetization in an M-t plot;

FIG. 6a shows a schematic representation of the magnetization state of a striped partial piece of an RF coil which was produced in accordance with the invention through tilting of the receiving coil element in the static magnetic field $B_0$;

FIG. 6b shows the associated temporal dependence of tilting in an α-t plot;

FIG. 6c shows the associated temporal dependence of the effective transverse magnetic field in a B-t plot;

FIG. 6d shows the associated temporal dependence of coil magnetization in an M-t plot;

FIG. 8a shows the temporal dependence of different simply stepped external magnetic field changes in a B-t plot, wherein the sign of the magnetic field change is inverted compared to FIG. 7a;

FIG. 8b shows the associated temporal dependence of coil magnetization in an M-t plot;

FIG. 10a shows the temporal dependence of a pulse-shaped external magnetic field change in a B-t plot, wherein the sign of the magnetic field change is inverted compared to FIG. 9a;

FIG. 10b shows the associated temporal dependence of coil magnetization in an M-t plot;

FIG. 13a shows the temporal dependence of a stepped external magnetic field change in a B-t plot, wherein a further small opposite field change occurs after a saturation pulse;

FIG. 13b shows the associated temporal dependence of coil magnetization in an M-t plot;

FIG. 13c shows the associated schematic analysis of the relationship between the external magnetic field and magnetization of a superconducting element;

FIG. 14a shows the temporal dependence of a stepped external magnetic field change in a B-t plot, wherein a further opposite field change is applied after a saturation pulse to reverse magnetization;

FIG. 14b shows the associated temporal dependence of coil magnetization in an M-t plot;

FIG. 14c shows the associated schematic analysis of the relationship between the external magnetic field and magnetization of a superconducting element;

DESCRIPTION OF THE PREFERRED EMBODIMENT

The inventive method cannot be applied to all superconducting coils but only to those which belong to the "CHTSM" (Coils with Homogeneous Transverse Saturation Magnetization) coil class. These are characterized in that their superconducting structures are oriented parallel to the static field $B_0$ (which is assumed to be parallel to the z axis). In addition, the maximum possible (saturation) magnetization $M_T$ which results from application of an effective transverse magnetic field $B_{T\,eff}$ within each macroscopic real or conceptual strip 11 (in FIG. 2a) is homogeneous over z (this situation is shown in FIG. 3a). Moreover, these coil types have only such superconducting structures which extend, to a sufficient degree, beyond the RF region ("RF") of the coil in the z direction (FIG. 1).

Figure 2A:
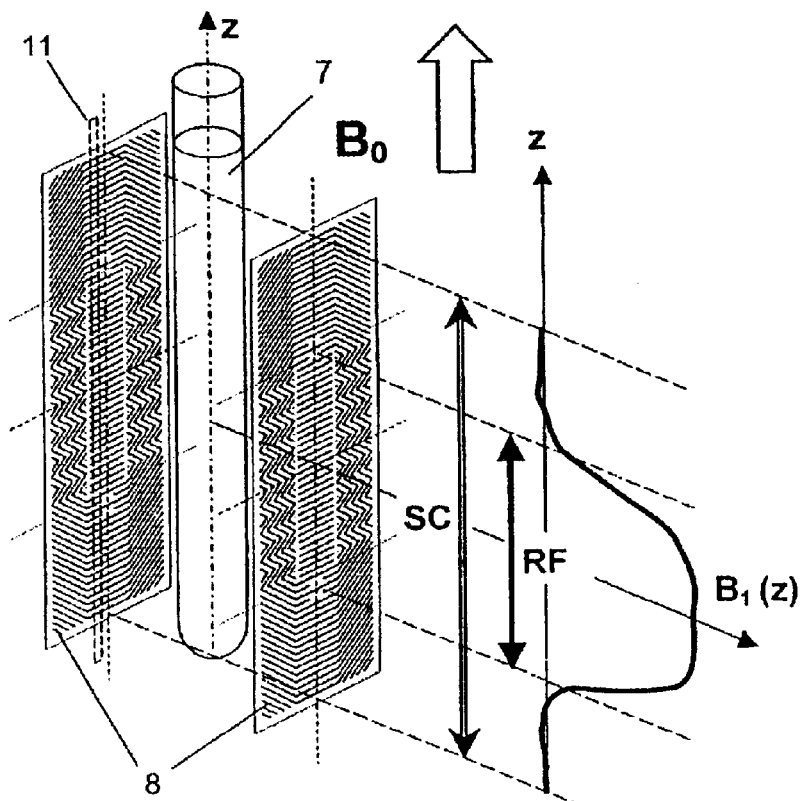
FIG. 2a shows an NMR receiving coil arrangement according to reference [6] to which the inventive method relates.

Two examples of such coil arrangements 8 are shown in FIG. 2 together with the sample tube 7 containing the NMR sample. FIG. 2a shows a coil according to [6] whose superconducting structures 8 are extended uniformly beyond the RF region (to the total length characterized by "SC").

Figure 2B:
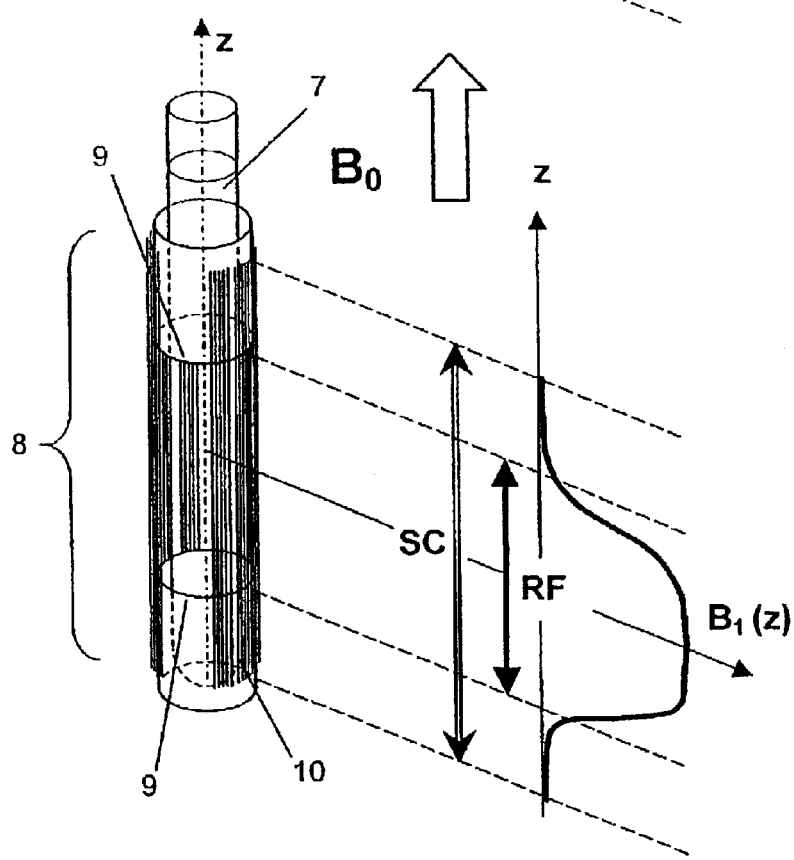
FIG. 2b shows an NMR receiving coil arrangement according to reference [5] to which the inventive method relates.

FIG. 2b shows a hybrid birdcage coil according to [5]. It also comprises a total length of striped superconducting elements 10 ("SC") which is longer than the RF region ("RF"). For this coil type, the RF region is limited by normally conducting elements 9 which form an integral part of the resonator.

To be able to apply the inventive method, the coils must be designed such that their transverse saturation magnetization is macroscopically constant along each conceptual striped region 11 extending in the z direction. This is normally automatically the case for the coil of FIG. 2b but constitutes a subclass of coils in the coil of FIG. 2a described in [6].

Magnetization is generated, as shown in FIG. 3, in magnetic reaction of a surface element of the superconducting NMR receiver coil arrangement to an external field change.

The elongated element 11 shown in FIG. 3a does not necessarily correspond to the entire coil but to each imaginary cut-out macroscopic part which extends as a strip along the z direction. The transverse magnetization of this part shall be examined irrespective of the internal structure. The strip-shaped element is divided into small elements 12 either in reality (as in the coil of FIG. 2a) or only conceptually (as in the coil of FIG. 2b).

In a type II superconductor, magnetization can be interpreted as a sequence of current loops, flowing in the superconductor. These currents I are produced, in general, as a reaction to external field changes. Since the superconductor tries to maintain the magnetic flux, shielding currents $I_{IND}$ are generated in response to an externally applied effective field change $dB_{T\ eff}$ which, in turn, produce magnetization $M_T$ which is opposite to the change $dB_T$ of the external field.

Since the strength of the currents which flow in the superconductor is limited by the maximum critical current densities, the strength of magnetization is also limited. FIG. 3b shows a simplified relationship between the external magnetic field $B_T$ and magnetization $M_T$ with $-M_{T\ MAX} \leq M_T \leq M_{T\ MAX}$. Starting from the unmagnetized state, increasingly negative $B_T$ increases magnetization to the maximum value $+M_{T\ MAX}$. With further reduction of $B_T$, magnetization remains at its maximum value (bold). The curve is hysteretic. When the change of $B_T$ is reversed, the global current $I_{IND}$ becomes smaller, changes sign and finally produces, at the maximum value, a magnetization of $-M_{T\ MAX}$. Details of this dependence are extensively shown in [6] and [2–3]. In this connection, it is important that the current loops $I_{IND}$ may, in principle, depend on the position in the strip element 11 and $I_{IND}$ (z) can generally have varying strength. $M_T$ thus also depends on z. Therefore, the overall function $M_T(z)$ must always be observed. The core of the method described in FIG. 3b is that, through application of a suitable field change $dB_T$, all $M_T(z)$ assume the same value, herein $+B_{T\ MAX}$, i.e. $M_T(z)=+B_{T\ MAX}$.

What sort of influence does the transverse magnetization of the superconducting components 8 or 10 have on the field dependence of the static magnetic field $B_0$ in the NMR sample 7?

Figure 1A:
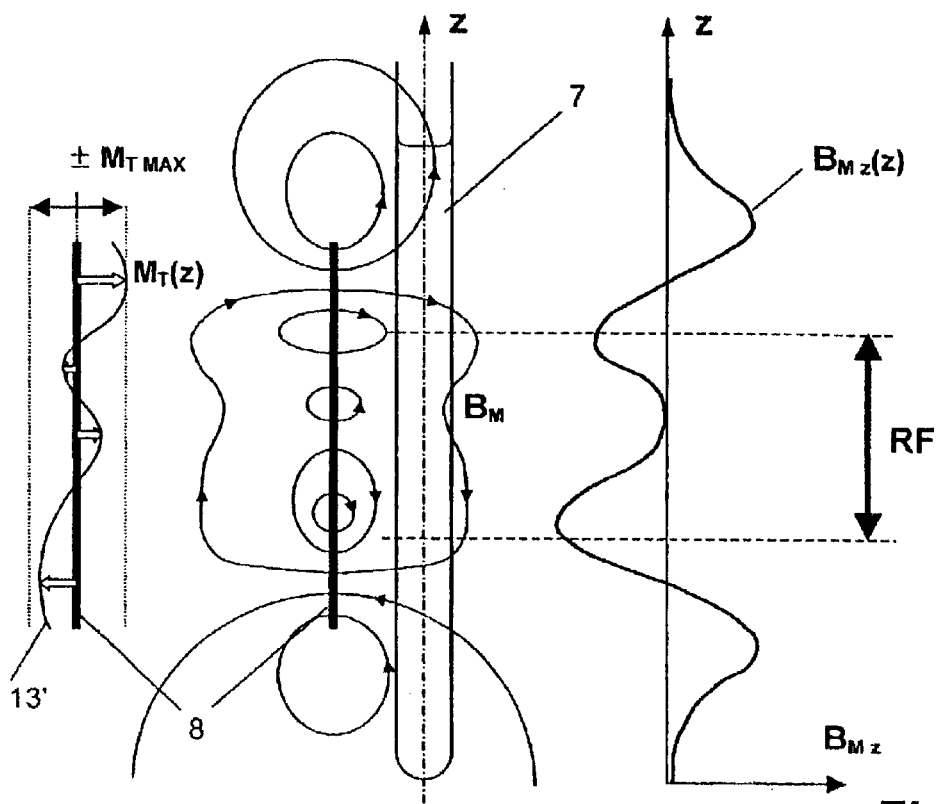
FIG. 1a shows the disturbing field $B_{MZ}$ caused by the superconducting components of an element of the NMR receiving coil arrangement before application of the inventive method.
Figure 1B:
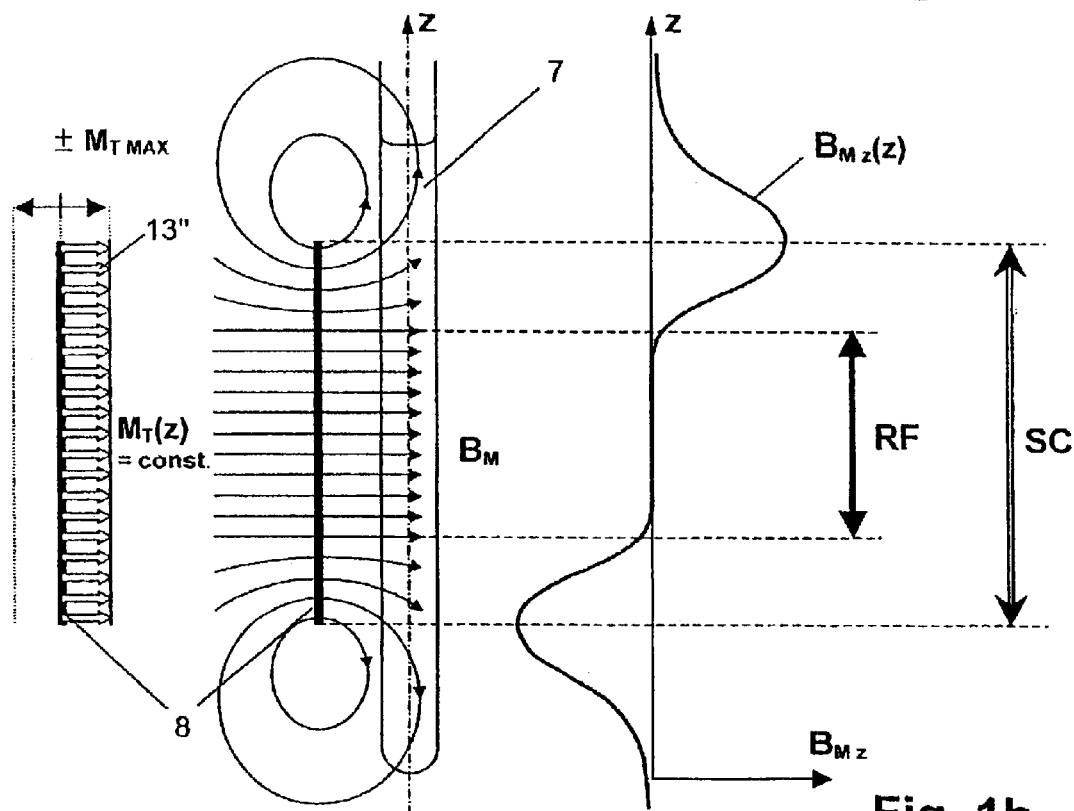
FIG. 1b shows the disturbing field $B_{MZ}$ caused by the superconducting components of an element of the NMR receiving coil arrangement after application of the inventive method.

This is shown in FIGS. 1a and 1b. Both drawings show (left-hand side) a superconducting element (here designated as 8) on the left-hand side of the receiving coil together with its transverse magnetization $M_T(z)$, whose dependence is shown as function of z. It should be noted that magnetization must be within the two maximum values $+M_{T\ MAX}$ and $-M_{T\ MAX}$.

The central representation shows the spatial dependence of the field lines of the disturbing magnetic field $B_M$ which result from the magnetization. Of interest for the NMR homogeneity are only the Bz components which are located within the sample and at the same time within the active RF region (derived in [6]). This is represented with "RF". The right-hand side shows the $B_z$ component along the sample center (z axis) as a function of z.

With regard to the effects of the method, FIG. 1a shows that a general dependence 13' of the transverse magnetization $M_T(z)$ produces a strongly disturbed dependence of the disturbing fields $B_M$ generated by magnetization as well as their z component $B_{MZ}$ and therefore a disturbed dependence of $B_z$ and therefore disturbances in the line shape of the NMR spectrum.

The inventive method was applied in FIG. 1b. It does not minimize magnetization of the superconductor itself, rather maximizes it in the simplest case shown herein. The disturbing fields $B_M$ in the sample therefore reach a maximum. Due to the fact that the magnetization 13" along z is largely constant, in accordance with [6] a field distribution of the $B_Z$ component results which produces strong disturbances at the ends of the superconducting structures (the z extension of same is characterized with "SC") but within the smaller RF region ("RF"), a practically vanishing dependence of $B_Z$. This practically eliminates the actual NMR disturbance which is produced only by the $B_Z$ component (see extensive discussion in [6]) through maximum magnetization.

Up to now, we have only discussed the simplest dependence of the field $B_T$ which is sufficient to obtain the desired effect. There are however a further number of possible and reasonable dependencies and different possible initial conditions. These effects will be discussed in more detail below.

FIG. 4a assumes a change in the external field $B_T$ as a function of time. FIG. 4b shows the associated reaction $M_T$ of a superconducting surface element also as a function of time. FIG. 4c shows the relationship between $B_T$ and $M_T$. The overall change in the field $B_T$ is $dB_T$.

Magnetization thereby becomes positive and approaches the maximum value $+M_{T\ MAX}$ irrespective of the initial state. If the field change exceeds the minimum required value $dB_{T\ MIN}$ (substantially given by the material) all surface elements become maximum and, in case of corresponding geometry, are uniformly magnetized irrespective of their original magnetization.

This is the basis of the method. In principle, it generates the desired homogeneous magnetization. FIGS. 4b and 4c clearly show that the entire group 14 of all possible magnetization states (dependence of magnetization as function of time is designated as 14', dependence as function of the field $B_T$ as 14", extremer bold, intermediate values dashed is transferred to the state of a uniquely defined maximum magnetization $+M_{T\ MAX}$. The only preconditions therefor are the corresponding geometry of the RF coils and application of a transverse field change $|dB_T| \geq dB_{T\ MIN}$, where $dB_{T\ MIN}$ is the field change required to completely remagnetize a superconducting element. This corresponds, in the extreme case, to an inverse of the (critical) current or the change of magnetization $2 \cdot M_{T\ MAX}$.

In the simplest fashion, the method is implemented with a field coil. FIG. 5a shows an RF coil 8 or a section thereof. A field coil 21 is disposed proximate thereto which can generate transverse field changes $dB_T$ through a change dI of the current I flowing therein. FIG. 5b shows the temporal change dI of the current I. It results in a change in the transverse external field by $dB_T$ (FIG. 5c) which produces a complete transverse magnetization $M_T$ within the entire section (FIG. 5d), irrespective of the initial state and dependence 14'. After termination of the method, the overall transverse magnetization is $M_T = M_{T\ MAX}$.

The transverse field $B_T$ must not necessarily be produced by a field coil. Another very effective implementation of the method is very easy to carry out: Therein, the transverse component is not produced directly through an external field but through the tilt (FIG. 6b) of the coil or individual elements 8 through the angle dα about an axis 19 which is preferably oriented perpendicular to the (very strong) external magnetic field $B_0$ (FIG. 6a). This produces, in the coordinate system of the superconductor, an effective field change $dB_{Teff}$ (FIG. 6c). It generates the same effects in the superconductor as the above-discussed component $B_T$ (FIG. 6d).

Figure 7:
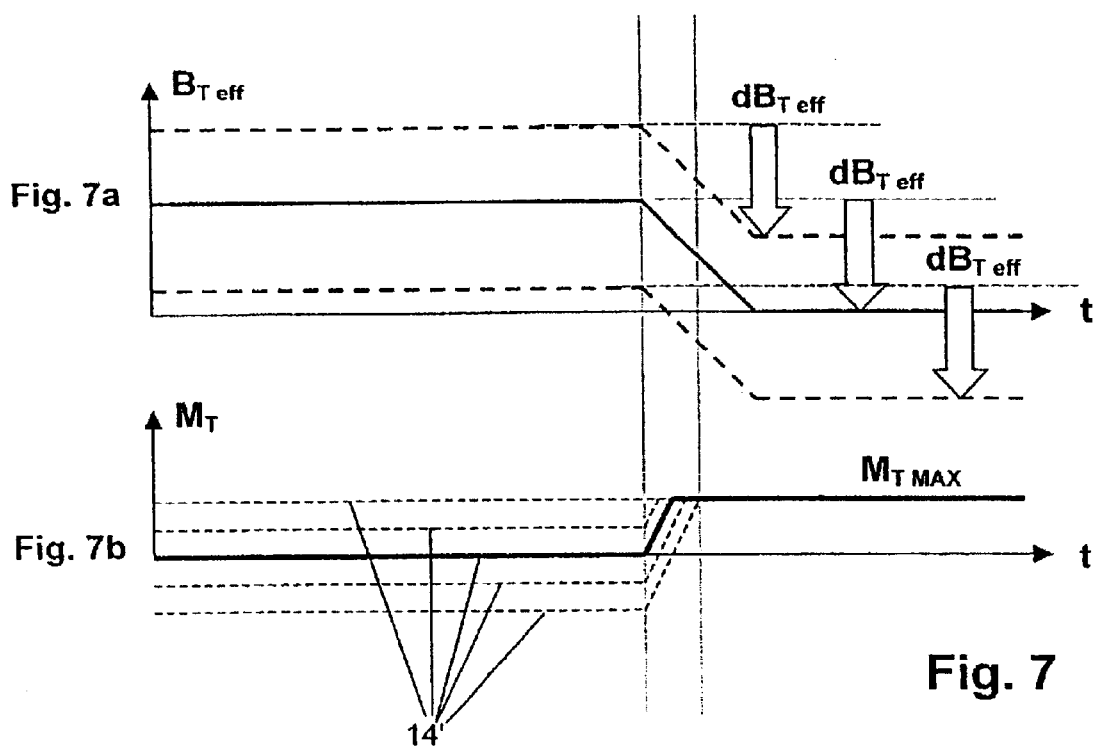
FIG. 7a shows the temporal dependence of different simple stepped external magnetic field changes in a B-t plot.
FIG. 7b shows the associated temporal dependence of coil magnetization in an M-t plot.

We would like to examine the effects on $M_T$ irrespective of the manner in which the transverse component $B_T$ is generated. Only the change $dB_T$ is relevant and not the absolute size of $B_T$. All dependencies shown in FIG. 7a (fully drawn or broken curves) of $B_T$ produce the same dependence with respect to magnetization (FIG. 7b). This is important in that there are no particular requirements concerning the precise value of the transverse field component.

Figure 8:
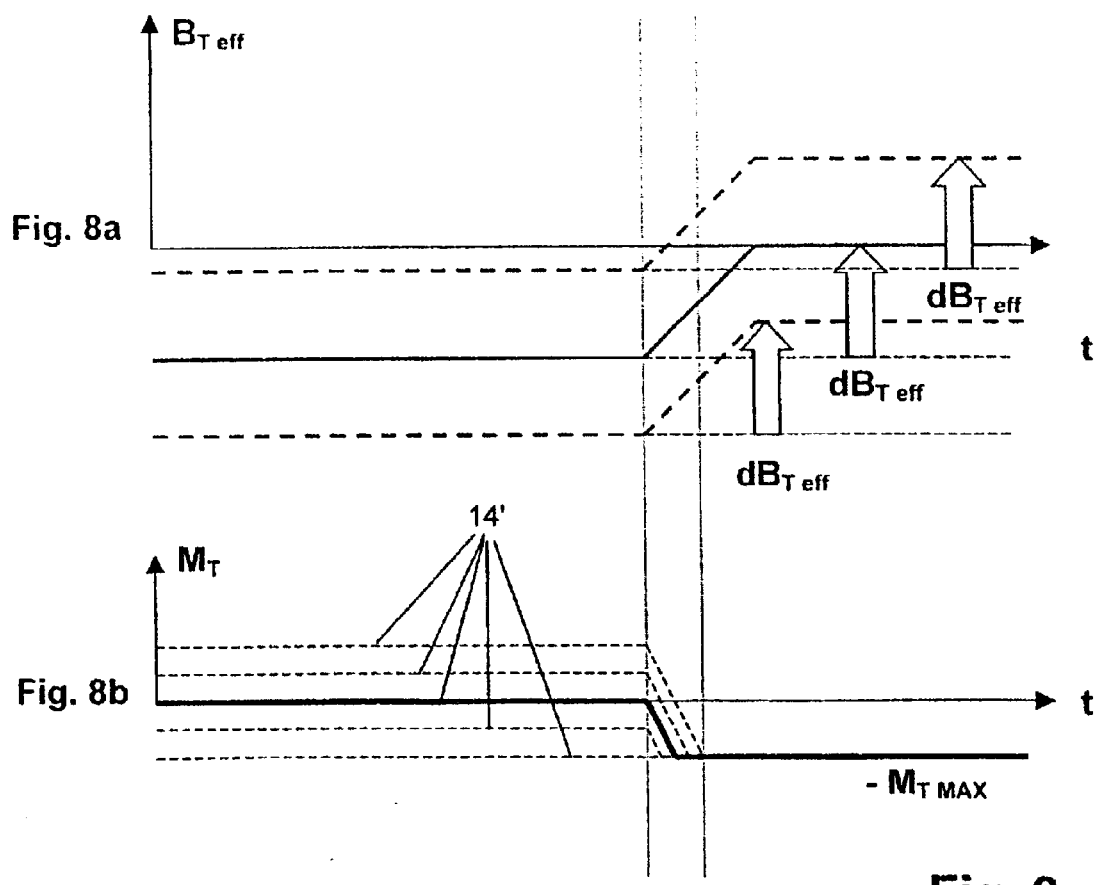

The aim of uniform magnetization has been obtained when all elements along z have the same magnetization. It is not important whether this magnetization is positive or negative. All three dependencies of $B_T(t)$ in FIG. 8a produce the same final magnetization $-M_{T\ MAX}$ (FIG. 8b). For practical application, one must emphasize that the sign of the overall applied effective field changes or of those between the individual coil elements is irrelevant.

Figure 9:
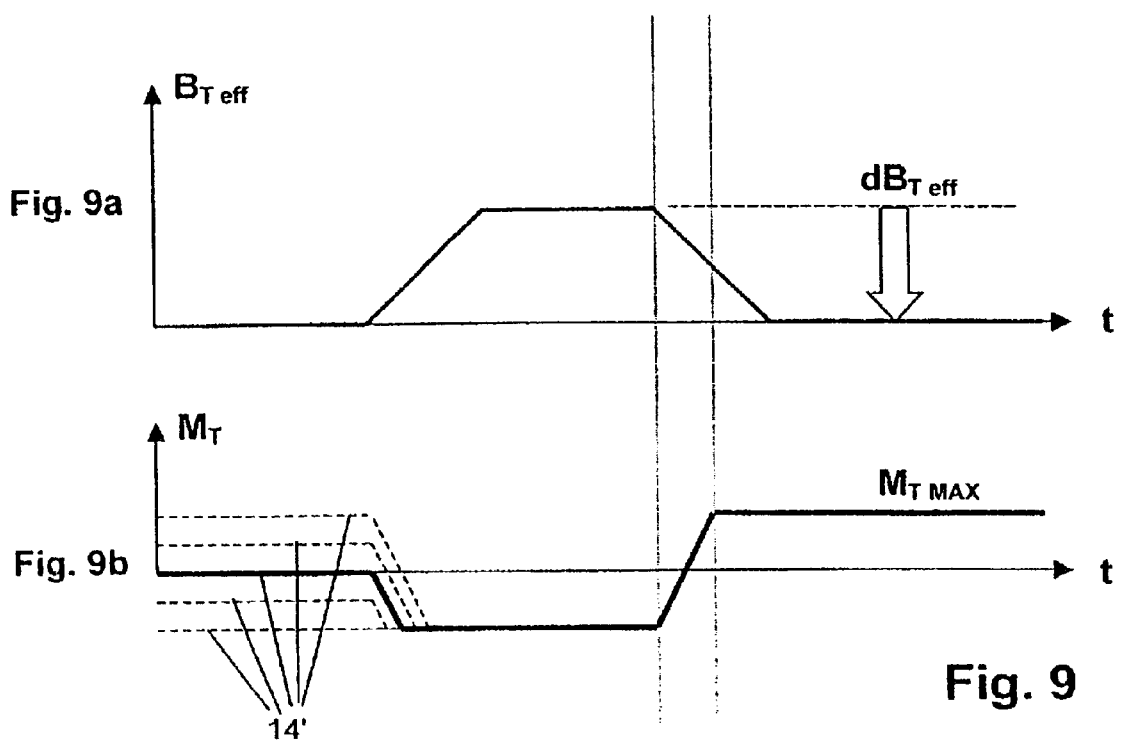
FIG. 9a shows the temporal dependence of a pulsed external magnetic field change in a B-t plot.
FIG. 9b shows the associated temporal dependence of coil magnetization in an M-t plot.

For technical reasons, it is advantageous or sometimes almost absolutely necessary that the initial and final state of the method be identical (reproducibility). Up to now only step functions were discussed in $B_T$. These are not absolutely necessary. Application of a pulse (with a positive and a negative side) is also possible. The only condition is that the amplitude $dB_{Teff}$ is sufficiently large (FIG. 9a). As clearly shown in FIG. 9b, all magnetization states which are initially possible are transferred into the single magnetization state $M_{T MAX}$.

Figure 10:
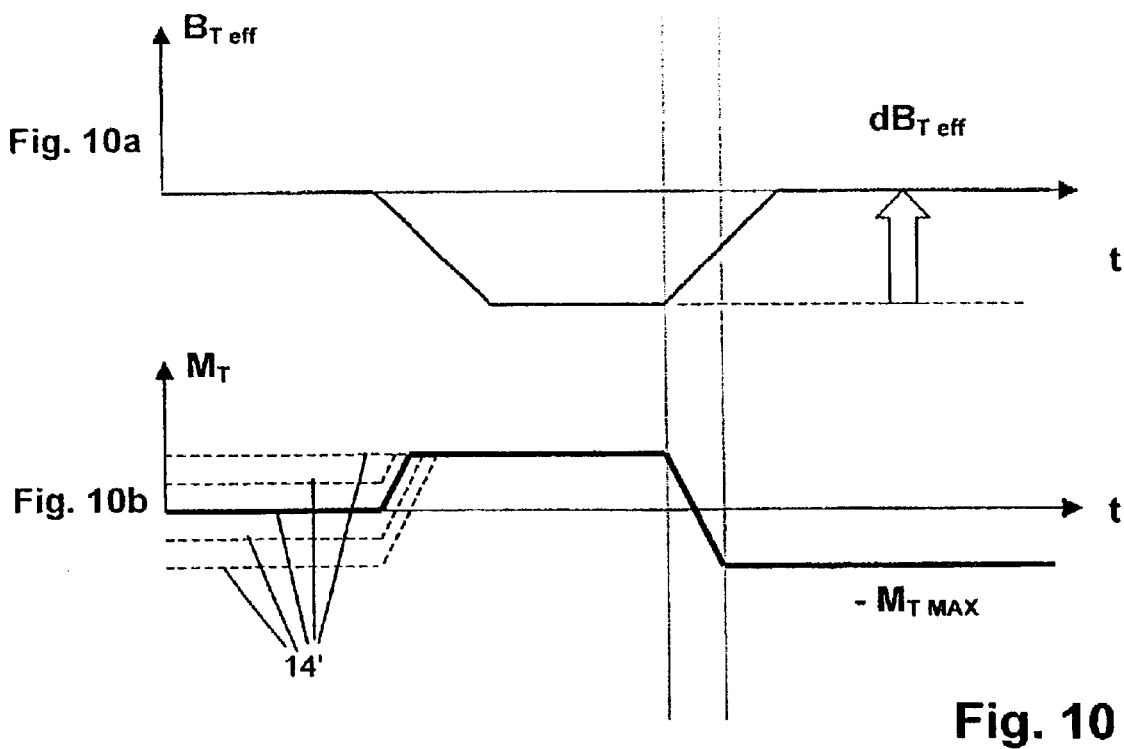

The signs are irrelevant to the technical realizations. A negative pulse (FIG. 10a) produces a negative but also uniform magnetization (FIG. 10b).

Figure 11:
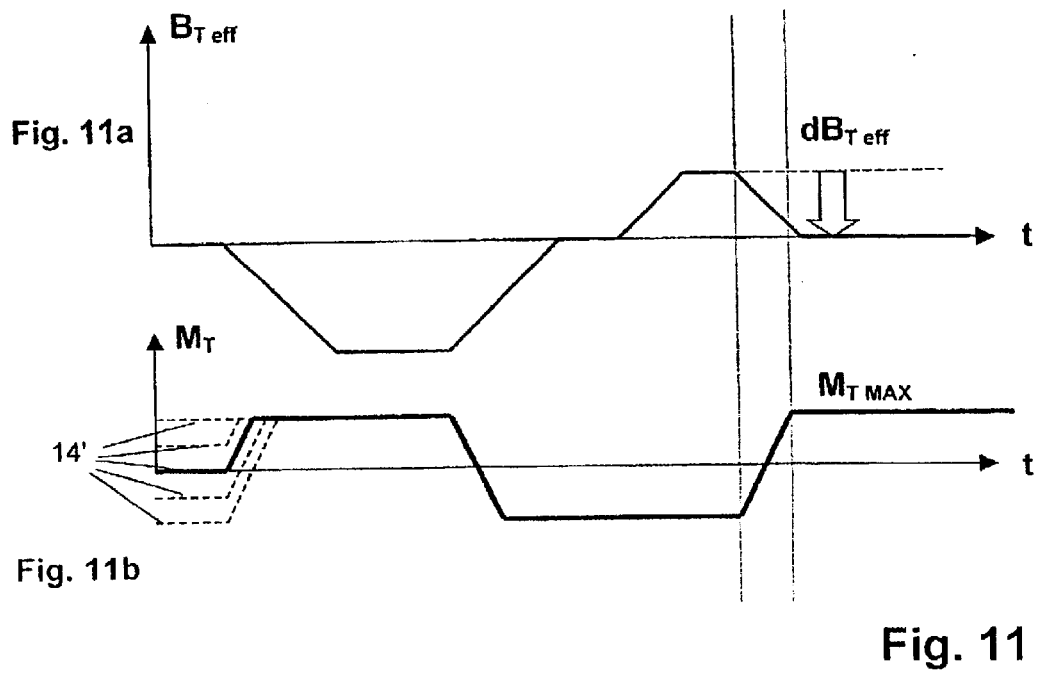
FIG. 11a shows the temporal dependence of a double pulse-shaped external magnetic field change in a B-t plot, wherein the two pulses have different signs.
FIG. 11b shows the associated temporal dependence of coil magnetization in an M-t plot.

The method can be further generalized. It also functions with a double pulse of any relative strength. $dB_{Teff}$ must be sufficiently large (FIG. 11).

Figure 12:
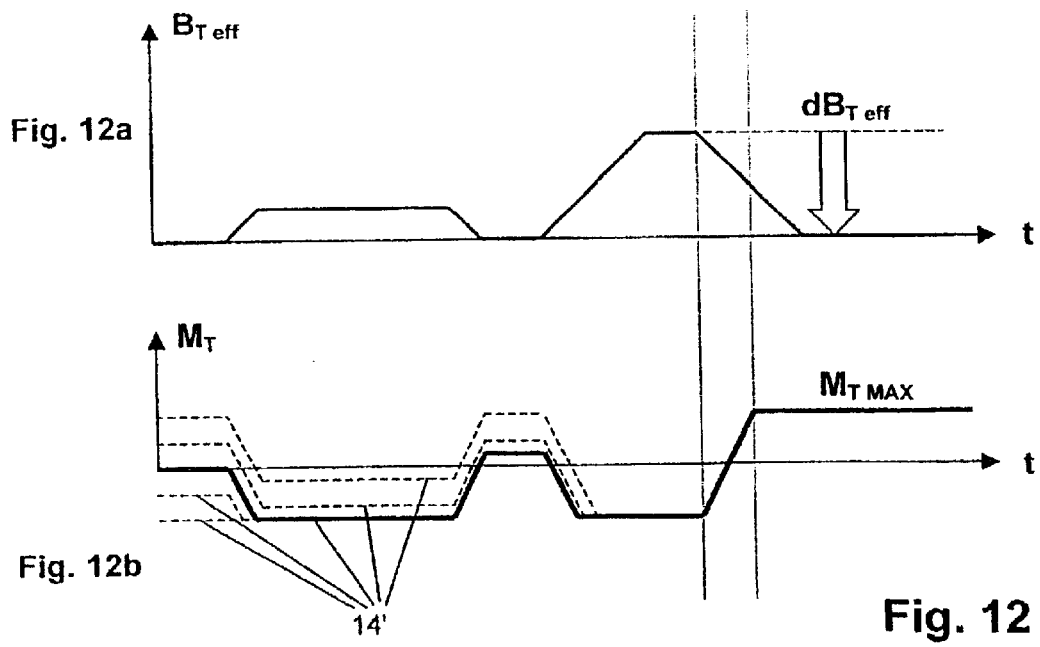
FIG. 12a shows the temporal dependence of a double-pulse-shaped external magnetic field change in a B-t plot, wherein the two pulses have the same sign.
FIG. 12b shows the associated temporal dependence of coil magnetization in an M-t plot.

The example of FIG. 12 shows the unlimited effectivity of the method, for two pulses of the same sign, again with the precondition that $dB_{Teff}$ is sufficiently large (FIG. 12a). Elements with any initial magnetization have the same final magnetization (FIG. 12b).

Up to now, examples of pulse sequences were shown which all ended with the field change $dB_T$ ($|dB_T| \geq dB_{T\ MIN}$). This was the "saturation pulse", whose task is to maximize magnetization of all elements ("saturation"). Below, we want to designate this field change separately as "$dB_{T\ SAT}$". Placing it at the end of the magnetic field sequence is the simplest and also the most robust case. This is, however, not necessary. There are other sequences which also produce the desired aim without this pattern:

An example thereof is shown in FIG. 13a. The saturation field change $dB_{TSAT}$ is followed by an additional field change $dB_{T\ FIN}$. It has an opposite sign to $dB_{TSAT}$ (otherwise their action could not be distinguished and consideration of this case would be superfluous).

The application of $dB_{T\ FIN}$ reduces the magnetization below the maximum value (FIG. 13b). FIG. 13c shows the dependencies in the $B_T$-$M_T$ plane. It is however important that the reduced magnetization (with corresponding design of the superconducting coil and the device for producing $B_T$) also remains constant (along z) (at a value $M_{T\ FIN}$ under $M_{T\ MAX}$) completely irrespective of the initial magnetization (different initial states of $M_T$ including their development are shown with broken lines in FIG. 13b as a function of time (14') and in FIG. 13c as a function of $B_T$ (14")). The goal of constant magnetization of all elements along z is still achieved. It is only important that the values of the different elements, which are disposed along z, are equal. It is not the purpose or goal of this method that $M_T=0$.

In the application according to FIG. 14, wherein the last pulse is sufficiently large, it is also possible to reverse the sign of $M_T$ with respect to the saturated value $M_{T\ MAX}$ (FIGS. 14b, c).

Figure 15:
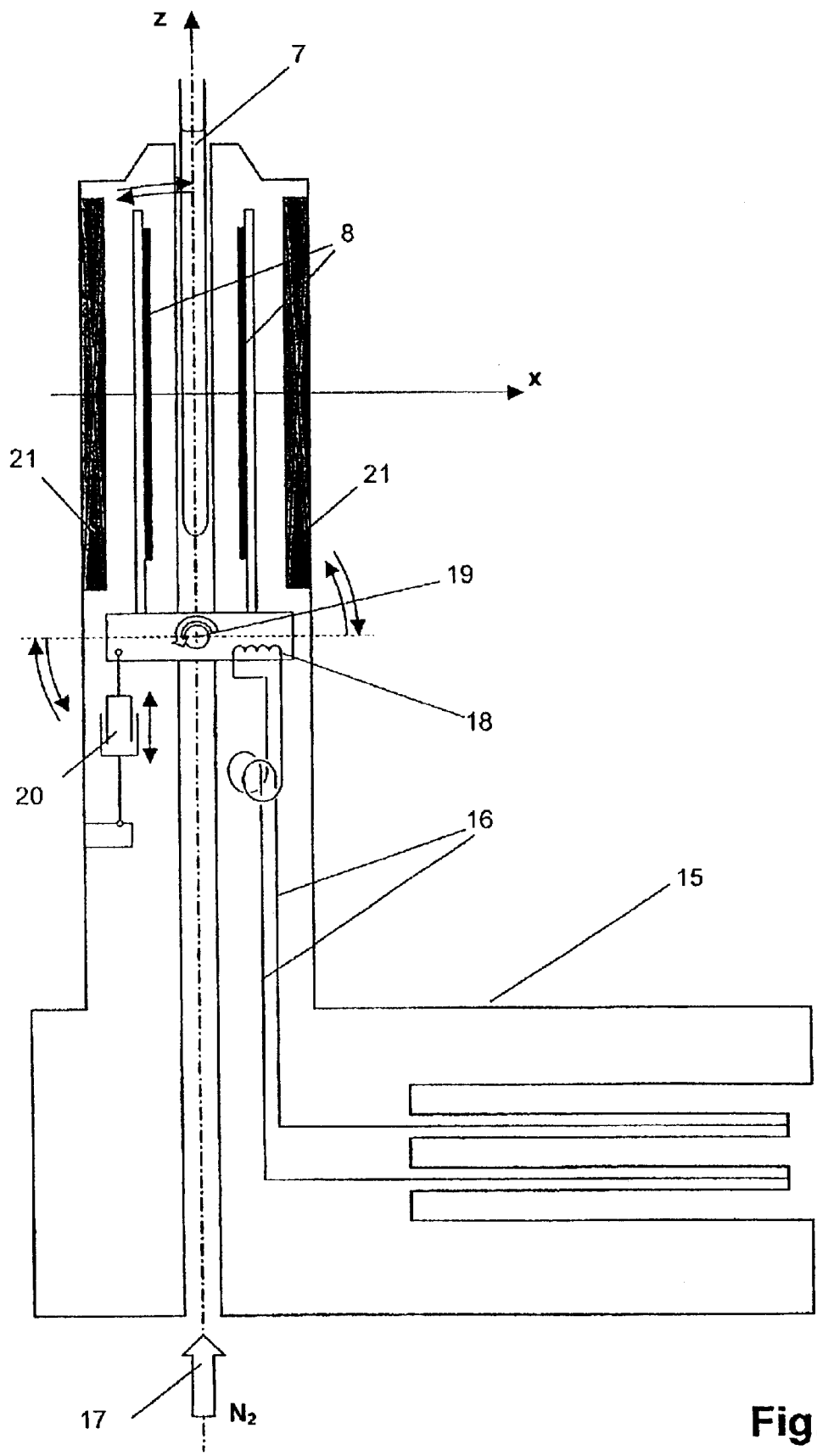
FIG. 15 shows an NMR probe head which can be used for carrying out the inventive method and is provided with devices for generating $B_T$ components in the x direction.

Up to now, the method was discussed only abstractly with reference to the fields to be applied. The required hardware will be briefly discussed below. FIG. 15 shows an overview of a cryo probe head with which the inventive method can be carried out.

The cryo probe head 15 comprises superconducting receiving coils 8. These are cooled by means of the heat exchanger 18 and cooling lines 16, through which gaseous or liquid He normally flows. The NMR sample to be measured is located in an opening of the probe head which is normally at or near room temperature and which is kept at the desired temperature through the temperature-controlling gas 17. The $B_T$ component can be independently generated through two different devices which are shown herein: Direct generation of a $B_x$ field through the field coils 21 or tilting the superconducting coil(s) 8 about the axis of rotation 19, wherein the tilt motion is achieved through an actuator 20.

Figure 16:
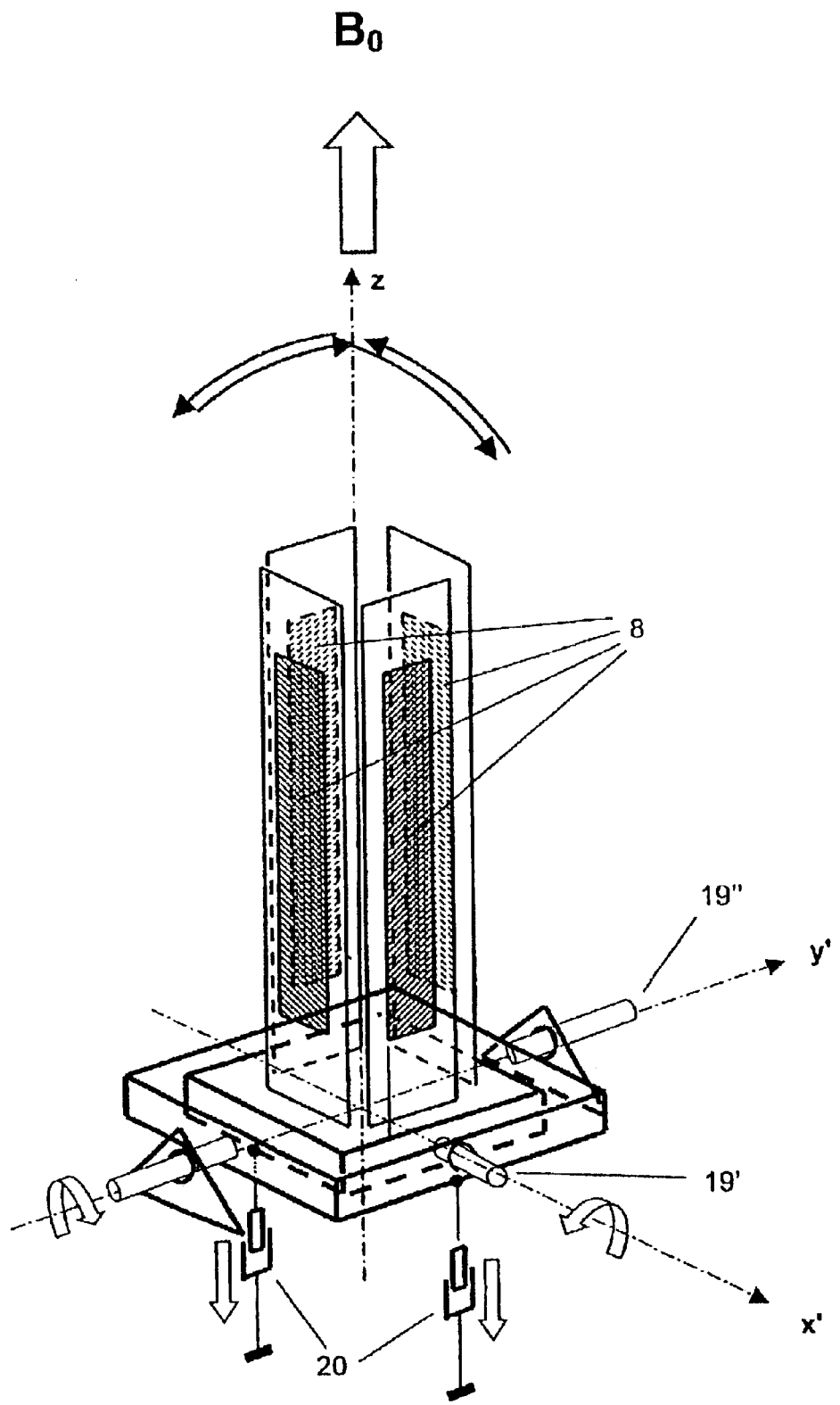
FIG. 16 shows a construction detail of a tilt device for an inventive receiver coil arrangement which is suited for application of effective transverse fields in two directions.

Up to now, the relationships were discussed which result for coils having superconducting elements parallel to one single plane (FIG. 2a or FIG. 15). Arrangements having a more general element arrangement (such as the arrangement of the coils 8 in FIG. 16 or the elements 10 in FIG. 2b) require transverse components of the $B_T$ field perpendicular to all existing planes and of a sufficient strength. This can be achieved through application of effective transverse fields in two different directions (FIG. 16). It can be implemented through use of two independent actuators 20 which permit rotation about the axis 19' in the x direction and about the axis 19" in the y direction. None of the axes 19', 19" and z are parallel to another. They are normally disposed perpendicular to each other. In the simplest case, they are tilted at first about one and then about the other axis. If suitable, these motions can be coupled, which corresponds to a tilt about one single inclined axis.

Figure 17:
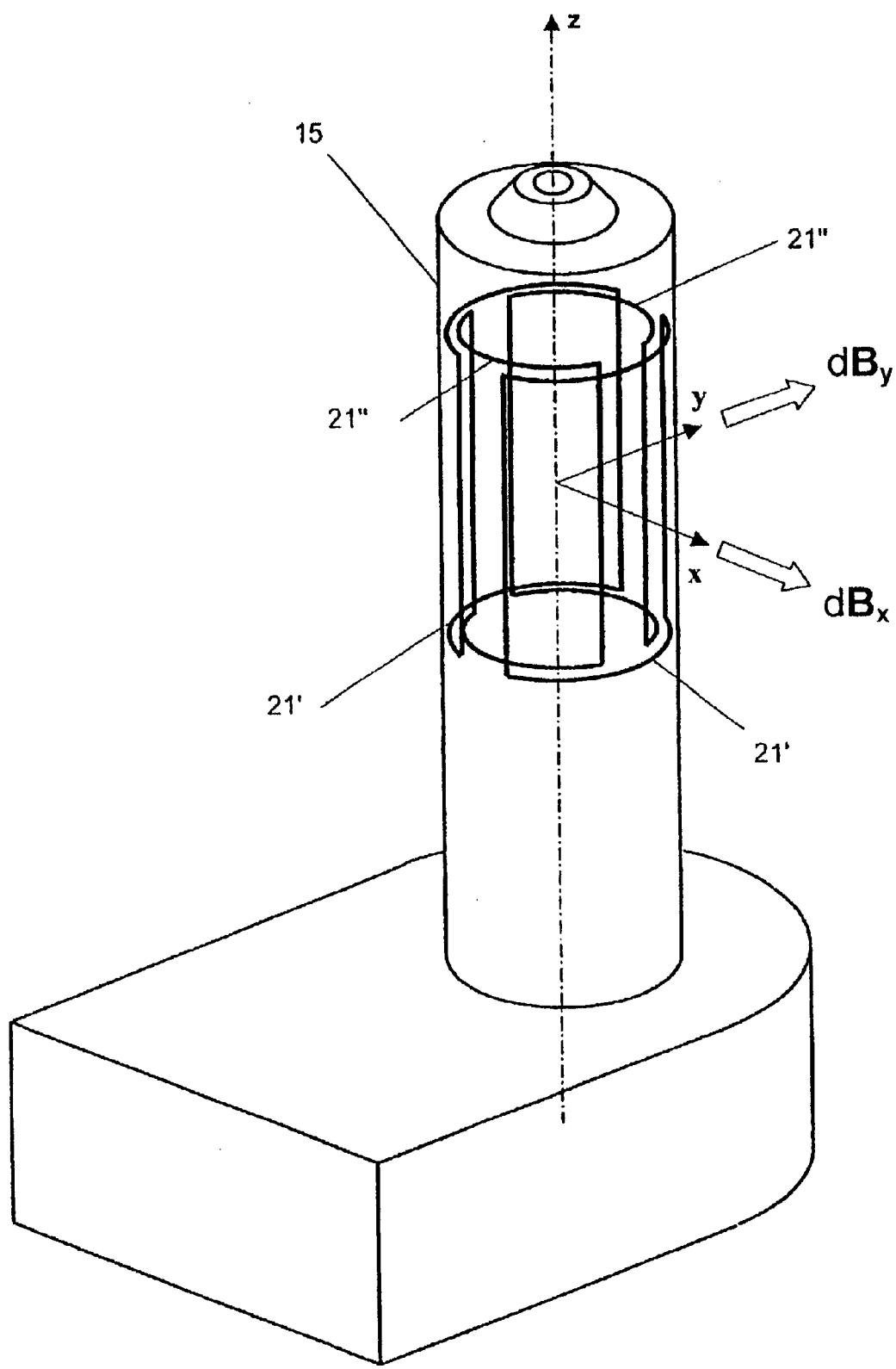
FIG. 17 shows a schematic arrangement of two field coil pairs which is suited for the inventive application of transverse fields in two directions.

Production of two fields with different directions can be implemented through corresponding arrangement of field coils (see FIG. 17). Two coil pairs 21' and 21" are installed in the probe head 15 which can produce transverse fields in the x or y direction. They can be controlled either one after the other or together.

As illustrated below, the method can often be carried out without any additional device.

Figure 18:
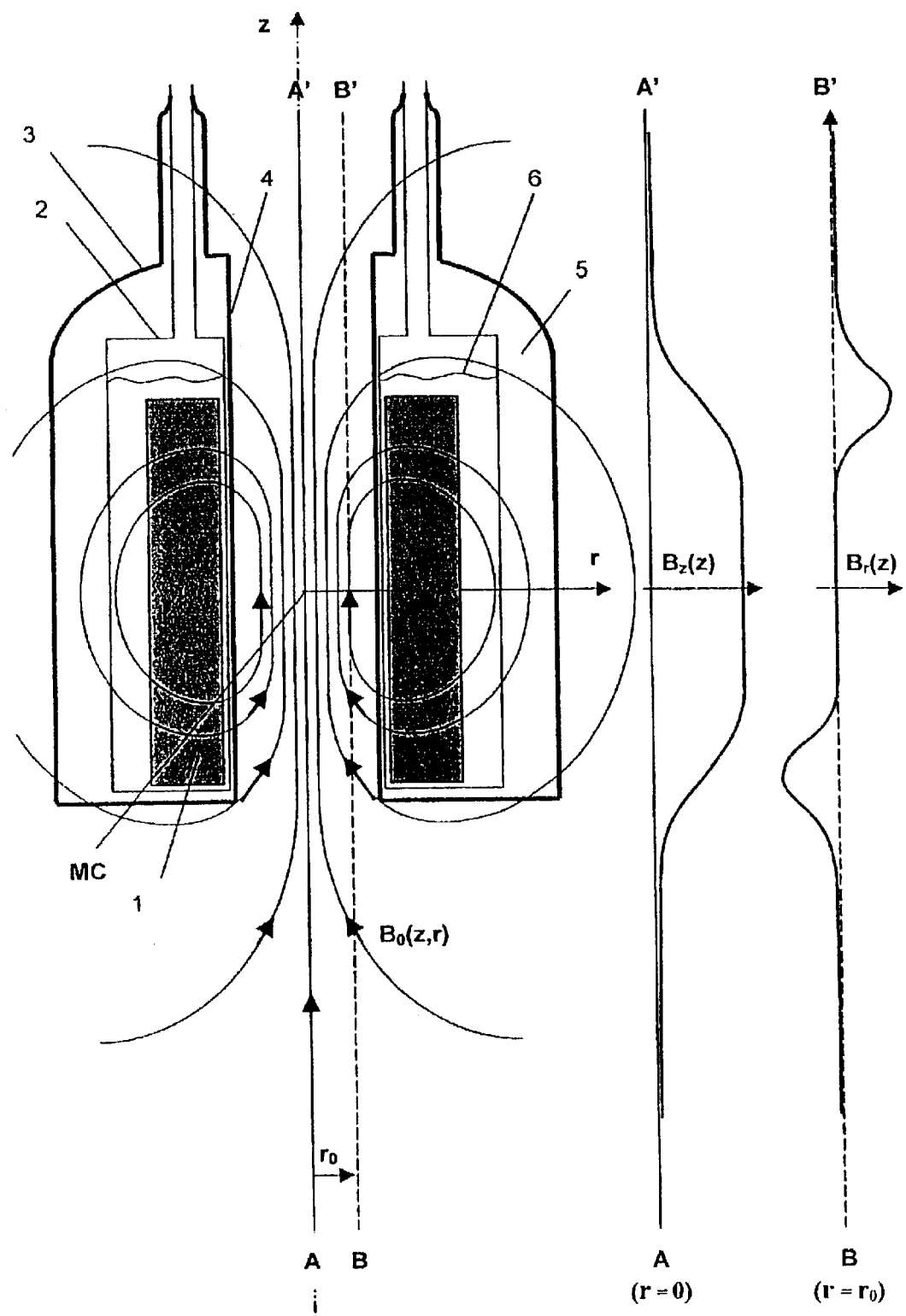
FIG. 18 is a schematic representation of the magnetic field lines of the static magnetic field $B_0$ of a superconducting magnet.

FIG. 18 shows the superconducting magnet 1 which is cooled by liquid helium 6 and is located in the He can 2. The He can 2 is thermally insulated from the outer wall 3 of the Dewar through the vacuum 5. The room temperature bore 4 receives the probe head 15 (FIGS. 15, 17). The dependence of the static magnetic field $B_0$ is thereby important. It forms a vector field $B_0$ (x,y,z) which is normally rotationally symmetrical and can therefore be described as $B_0(z,r)$. The dependence of this field is essential both inside and also outside of the magnet room temperature bore 4: The extremely homogeneous region of the magnetic field used during operation of the spectrometer is located in a narrow region about the magnet center "MC". The dependence of the relevant $B_z$ component $B_z(z)$ is shown separately along the z axis, defined by the line A-A'. Due to the rotational symmetry about the z axis, the field is oriented precisely in the z direction along the entire z axis. There are no transverse components $B_T$ (in the form of $B_T$ or $B_x$, $B_y$). The homogeneous region is visible within the magnet as well as the rapid field drop towards the magnet ends as well as the asymptotic decaying stray field drop outside of the magnet.

Interesting for the inventive method is the field dependence outside of the z axis: The $B_z$ component on a line B-B' at a separation $r_0$ from the z axis is similar (not shown herein) to that on the z axis itself. It is important that, outside of the axis, there are well defined transverse (i.e. radial) components ($B_T$) of the static field. Since div B=0, Gauss's theorem requires that any change of $B_z$ in the z direction necessarily produces a radial component $B_r$ of the field at a separation $r_0$ from the z axis. To a good approximation, the following is valid:

$$B_r(z, r_0) = -\frac{1}{2} r_0 \frac{dB_z(z, 0)}{dz}$$

For an assumed magnetic field of 10T and a steepest drop of this field which is supposed to correspond to the decay of the total field over a distance of 200 mm, one obtains for a separation of $r_0$=4 mm from the axis of symmetry, a maximum radial field component for $B_T$ of $B_r$=1000 G. This is generally sufficient to effect complete magnetization of the superconductors which are currently used to construct the superconducting RF coils.

Figure 19:
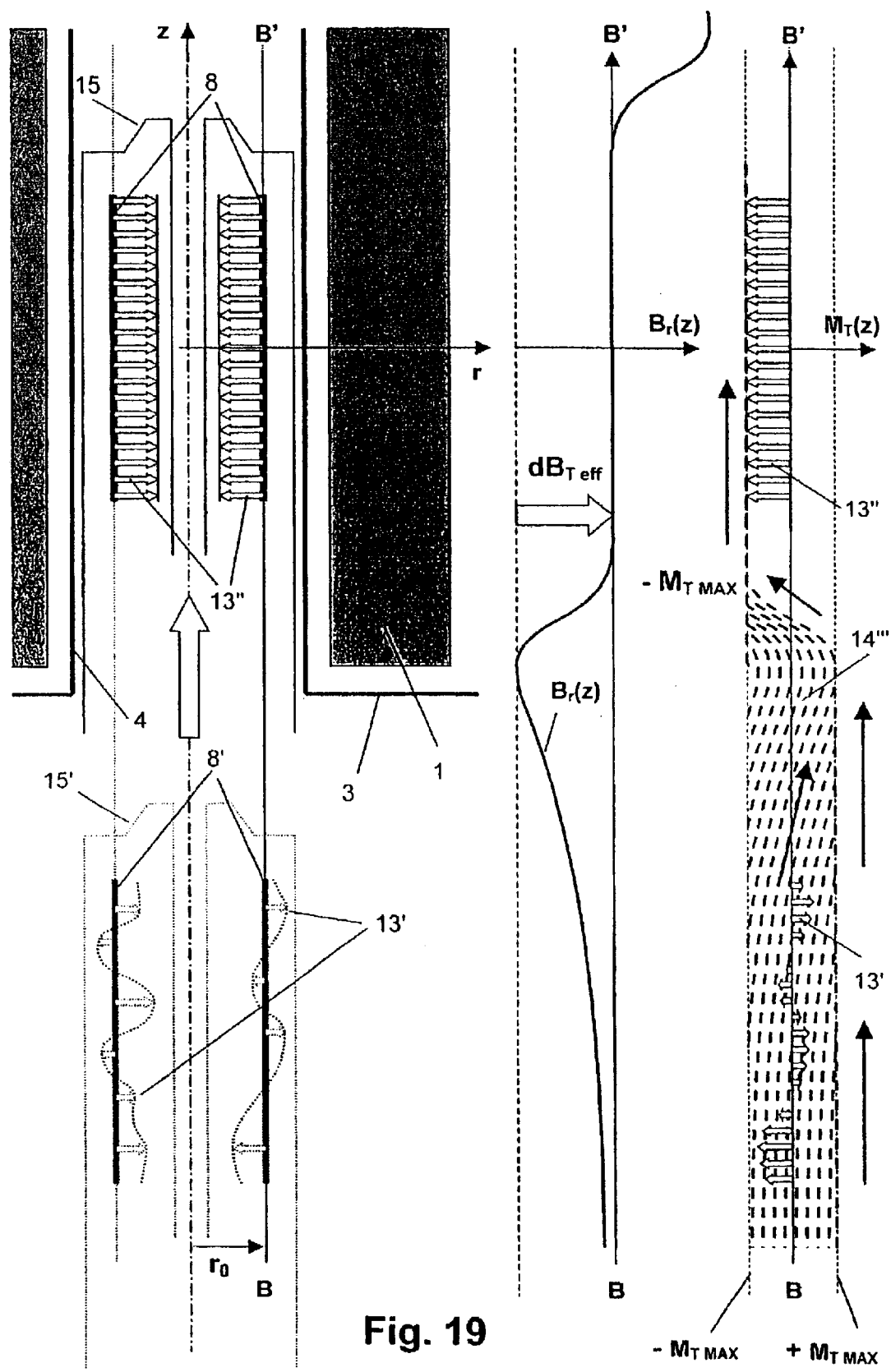
FIG. 19 is a schematic representation of the inventive method which utilizes the dependence of the transverse static magnetic field during insertion or reinsertion of the probe head, comprising coil elements in the superconducting state, into the magnet.

The $B_r$ component along the line B-B' is separately shown. In both regions where the $B_z$ field has the steepest increasing and decreasing dependencies, it exhibits a respective relatively strong maximum. This is used for a very simple but effective variant of the inventive method as shown in detail in FIG. 19. The working position of the cryo probe head in the magnetic center within the magnet bore 4 is designated as 15 together with the superconducting elements 8 of the receiving coil system. They are located at a separation $r_0$ from the z axis. B-B' characterizes a line parallel to the z axis at this separation. The schematic dependence of the radial field component $B_r(z)$ is taken from FIG. 18 and is separately shown. It corresponds substantially to the transverse field component $B_T$ which has been extensively discussed.

In the variant of the inventive method shown herein, the already cold, superconducting coil system is inserted into the magnet. This is possible e.g. through insertion of the entire probe head from a position 15' outside of the working position 15. As will become apparent, the last piece to be inserted is relevant and the history is unimportant. In particular, the already cooled probe head, located in the working position 15 can be removed from the working position 15 into the position 15' and then displaced back into the working position 15. We now assume that the superconducting coil elements are located in the position 8'. They are assumed to initially have any arbitrary magnetization 13' $M_T(z)$.

The magnetization dependencies associated with introduction into the working position 15, are shown on the right-hand side in the plot $M_T(z)$. Corresponding to the dependence of the transverse field $B_r(z)$, trajectories 14''' result analog to FIG. 4 or 9 which the magnetization follows during insertion. The initial magnetization 13' is transferred, irrespective of the initial state, into the maximum negative magnetization $-M_{T\ MAX}$ which is identical for all elements. This always happens when the change $dB_{T\ eff}$ is sufficiently large ($\geq dB_{T\ MIN}$, see FIG. 4) and the superconducting coil is introduced from a sufficiently distant, drawn-out position.

This method obtains the desired homogenisation of the transverse magnetization and elimination of NMR disturbances, in accordance with the transition from FIG. 1a to FIG. 1b, in a very simple, extremely effective, and robust fashion.

This method is also suited, in particular, to condition coils having superconducting arrangements in a plurality of non-parallel planes as shown in the arrangement of the coils 8 in FIG. 16 or elements 10 in FIG. 2b. All planes containing superconducting elements are substantially perpendicular to the radius vector $r_0$ and are all simultaneously and effectively magnetized.

List of Reference Numerals
1 Superconducting magnet
2 He can
3 magnet dewar (outer shell)
4 RT Bore
5 magnet vacuum
6 LHe for cooling the magnet
7 sample
8 superconducting RF receiving coil
8' superconducting RF receiving coil outside of the working position
9 normally conducting shielding of the hybrid birdcage coil
10 superconducting element of the hybrid birdcage coil
11 z strip as conceptual section of the SC coil
12 superconducting element of the RF coil
13 transverse magnetization in general
13' transverse unordered magnetization
13" transverse saturated magnetization
14 trajectories of magnetization in general
14' trajectories of magnetization as a function of t
14" trajectories of magnetization as a function of $B_T$
14''' trajectories of magnetization as a function of z
15 cryo probe head
15' cryo probe head outside of the working position
16 cooling lines
17 N2 VT gas
18 cooling heat exchanger for receiving coil
19 axis of rotation in general
19' axis of rotation about the x axis
19" axis of rotation about the y axis
20 actuator
21 field coils for magnetization in general
21' field coils for magnetization in the x direction
21" field coils for magnetization in the y direction References:
[1] U.S. Pat. No. 5,619,140
[2] WO 99/24845
[3] WO 99/24821
[4] U.S. Pat. No. 5,572,127
[5] DE 197 33 574 A1
[6] DE 101 50 131.5-33 (not yet published)

I claim:

1. A method for influencing a homogeneous static magnetic field $B_0$ in a direction of a z axis in a nuclear magnetic resonance (NMR) apparatus to reduce disturbances caused by superconducting components of a radio frequency (RF) coil for the reception of NMR signals from a sample in a measuring volume of the NMR apparatus, wherein superconducting components of the RF coil extend beyond an RF active region of the sample in the z direction, the disturbances concerning a z component of the $B_0$ field in the RF active region of the sample, the method comprising the step of:

exposing the superconducting components of said RF coil to an additional magnetic field of sufficient strength that all superconducting structures in the superconducting components of said RF coil which are disposed in the vicinity of the RF active region of the sample are maximally magnetized during application of this additional magnetic field such that their magnetization along the z axis which is transverse to $B_0$ assumes a value which is substantially constant and not equal to zero.

2. The method of claim 1, wherein a temporal dependence of said additional magnetic field is selected such that the superconducting structures also remain maximally magnetized after application of said additional magnetic field thereby maximizing a magnetic field in the sample region caused thereby.

3. The method of claim 1, wherein said additional magnetic field is applied transverse to the static magnetic field $B_0$.

4. The method of claim 3, wherein said additional magnetic field which acts on the superconductor is generated through tilt of the superconducting RF coil or RF coil arrangement about an axis which is not parallel to the direction of $B_0$.

5. The method of claim 1, wherein said additional magnetic field is generated by a field coil.

6. The method of claim 1, wherein said additional magnetic field is generated by at least two field coils which are activated one after another such that, during activation, all components of said superconducting receiving RF coil which are disposed in a vicinity of the RF active region of the sample are maximally magnetized at least once.

7. The method of claim 3, wherein said transverse additional magnetic field which acts on the superconductor is generated by successive tilting said superconducting RF receiving coil or RF receiving coil arrangement about two axes which are not parallel to the $B_0$ direction.

8. The method of claim 1, wherein said transverse additional magnetic field is generated by initial or repeated introduction of said RF coil, in the superconducting state, into the magnet which generates the static magnetic field $B_0$.

9. The method of claim 3, wherein a change in said transverse additional magnetic field has only one sign.

10. The method of claim 3, wherein said transverse additional magnetic field is generated by one single pulse with an amplitude such that a final magnetization of the superconducting components is non-zero.

11. The method of claim 3, wherein said transverse additional magnetic field is generated by a double or multiple pulse, wherein a last pulse has an amplitude and sign such that a final magnetization of said superconducting components is non-zero.

12. The method of claim 3, wherein said transverse additional magnetic field is generated by a double pulse, wherein a second pulse has a sign opposite to that of a first pulse and the amplitudes of both pulses are approximately equal.

13. An NMR (nuclear magnetic resonance) resonator for use in the method of claim 1.

14. The resonator of claim 13, wherein said superconducting conductor structures are oriented substantially parallel to the $B_0$ direction.

15. The resonator of claim 13, wherein a material of said superconducting conductor structures is selected such that they also keep their maximum magnetization after application of said additional magnetic field to thereby maximize a magnetic field which they produce in the sample region.

16. The resonator of claim 13, wherein a maximum magnetization of said superconducting conductor structures transverse to the direction of $B_0$ is substantially homogeneous over z.

17. A device for influencing a homogeneous static magnetic field $B_0$ in a direction of a z axis in a nuclear magnetic resonance (NMR) apparatus to reduce disturbances caused by superconducting components of a radio frequency (RF) coil for the reception of NMR signals from a sample in a measuring volume of the NMR apparatus, wherein superconducting components of the RF coil extend beyond an RF active region of the sample in the z direction, the disturbances concerning a z component of the $B_0$ field in the RF active region of the sample, the device comprising:

means for exposing the superconducting components of said RF coil to an additional magnetic field of sufficient strength that all superconducting structures in the superconducting components of said RF coil which are disposed in the vicinity of the RF active region of the sample are maximally magnetized during application of this additional magnetic field such that their magnetization along the z axis which is transverse to $B_0$ assumes a value which is substantially constant and not equal to zero.

18. An NMR apparatus for investigation of a measuring sample in an investigational volume disposed about a coordinate origin (x,y,z=0) of the apparatus, the apparatus comprising:

means for generating a homogeneous magnetic field $B_0$ in a direction of a z axis;

at least one RF (radio frequency) coil for emitting or receiving RF signals at one or more desired resonance frequencies into or from the measuring sample, said RF coil having superconducting conductor structures disposed at a radial (x, y) separation from the measuring sample, said superconducting conductor structures extending beyond an RF active part of the measuring sample in a z direction; and means for application of an additional magnetic field such that all superconducting conductor structures have maximum transverse magnetization with respect to a $B_0$ direction to produce a transverse magnetization having a substantially constant value along the z axis which is not equal to zero.

* * * * *

UNITED STATES PATENT AND TRADEMARK OFFICE
CERTIFICATE OF CORRECTION

PATENT NO. : 6,747,455 B2
DATED : June 8, 2004
INVENTOR(S) : Marek, Daniel

It is certified that error appears in the above-identified patent and that said Letters Patent is hereby corrected as shown below:

Title page,
Item [54], Title, please replace as follows:
-- MAGNETIC HOMOGENIZATION OF SUPERCONDUCTING RF COILS FOR THE RECEPTION OF NMR SIGNALS --
Item [73], Assignee, should read as follows: -- Bruker BioSpin AG --.

Signed and Sealed this

Twelfth Day of April, 2005

JON W. DUDAS
*Director of the United States Patent and Trademark Office*